(12) United States Patent
Seo et al.

(10) Patent No.: US 12,744,528 B2
(45) Date of Patent: Sep. 22, 2026

(54) CLOCK TRANSMISSION CIRCUIT

(71) Applicant: SK hynix Inc., Gyeonggi-do (KR)

(72) Inventors: Beom Kyu Seo, Gyeonggi-do (KR); Bon Kwang Koo, Gyeonggi-do (KR); Soon Sung An, Gyeonggi-do (KR); Sung Hwa Ok, Gyeonggi-do (KR); Jun Seo Jang, Gyeonggi-do (KR); Eun Ji Choi, Gyeonggi-do (KR); Jae Hyeong Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/918,069

(22) Filed: Oct. 17, 2024

(65) Prior Publication Data

US 2025/0330176 A1 Oct. 23, 2025

(30) Foreign Application Priority Data

Apr. 23, 2024 (KR) ........................ 10-2024-0053985

(51) Int. Cl.
*H03K 17/687* (2006.01)
*H03K 3/037* (2006.01)
*G11C 7/22* (2006.01)

(52) U.S. Cl.
CPC ......... *H03K 17/6872* (2013.01); *H03K 3/037* (2013.01); *G11C 7/222* (2013.01)

(58) Field of Classification Search
CPC .. H03K 17/6872; H03K 3/037; H03K 5/1565; G11C 7/222; H04L 7/0037; G06F 1/10
USPC .......................................................... 327/108
See application file for complete search history.

(56) References Cited

U.S. PATENT DOCUMENTS 5,672,991 A * 9/1997 Thoma .................... H03K 5/133 327/239
6,975,151 B2 * 12/2005 Akiyoshi ......... H03K 3/356121 327/212
8,618,842 B2 * 12/2013 Kwon .................... H03K 5/151 327/108
10,749,508 B1 * 8/2020 Jain ........................ H03K 3/017
2001/0050583 A1 * 12/2001 Fulkerson .......... H03K 3/35625 327/215
2002/0093368 A1 * 7/2002 Fulkerson ............. H03K 3/012 327/203
2006/0066377 A1 * 3/2006 Davis ........................ G06F 1/10 327/295

(Continued)

FOREIGN PATENT DOCUMENTS

KR 10-2016-0050194 A 5/2016

*Primary Examiner* — Ryan Jager
(74) *Attorney, Agent, or Firm* — IP & T GROUP LLP

(57) ABSTRACT

A clock transmission circuit including a first inverter configured to inversion-drive a first transmission node in response to a first clock signal, among differential clock signals that are loaded onto a first reception node, a second inverter configured to inversion-drive a second transmission node in response to a second clock signal, among the differential clock signals that are loaded onto a second reception node, a first additional driver configured to additionally drive the first transmission node in response to the second clock signal that is loaded onto the second reception node, and a second additional driver configured to additionally drive the second transmission node in response to the first clock signal that is loaded onto the first reception node.

18 Claims, 12 Drawing Sheets

(56) References Cited

U.S. PATENT DOCUMENTS

2008/0054944 A1* 3/2008 Kwon .................. H03K 19/094
326/83
2013/0082769 A1* 4/2013 Kwon .................. H03K 5/1565
327/581
2013/0188428 A1* 7/2013 Ma ....................... H03K 3/0375
327/202
2023/0224191 A1 7/2023 Wang et al.
2025/0330176 A1* 10/2025 Seo .................... H03K 17/6872

* cited by examiner

Figure 11:
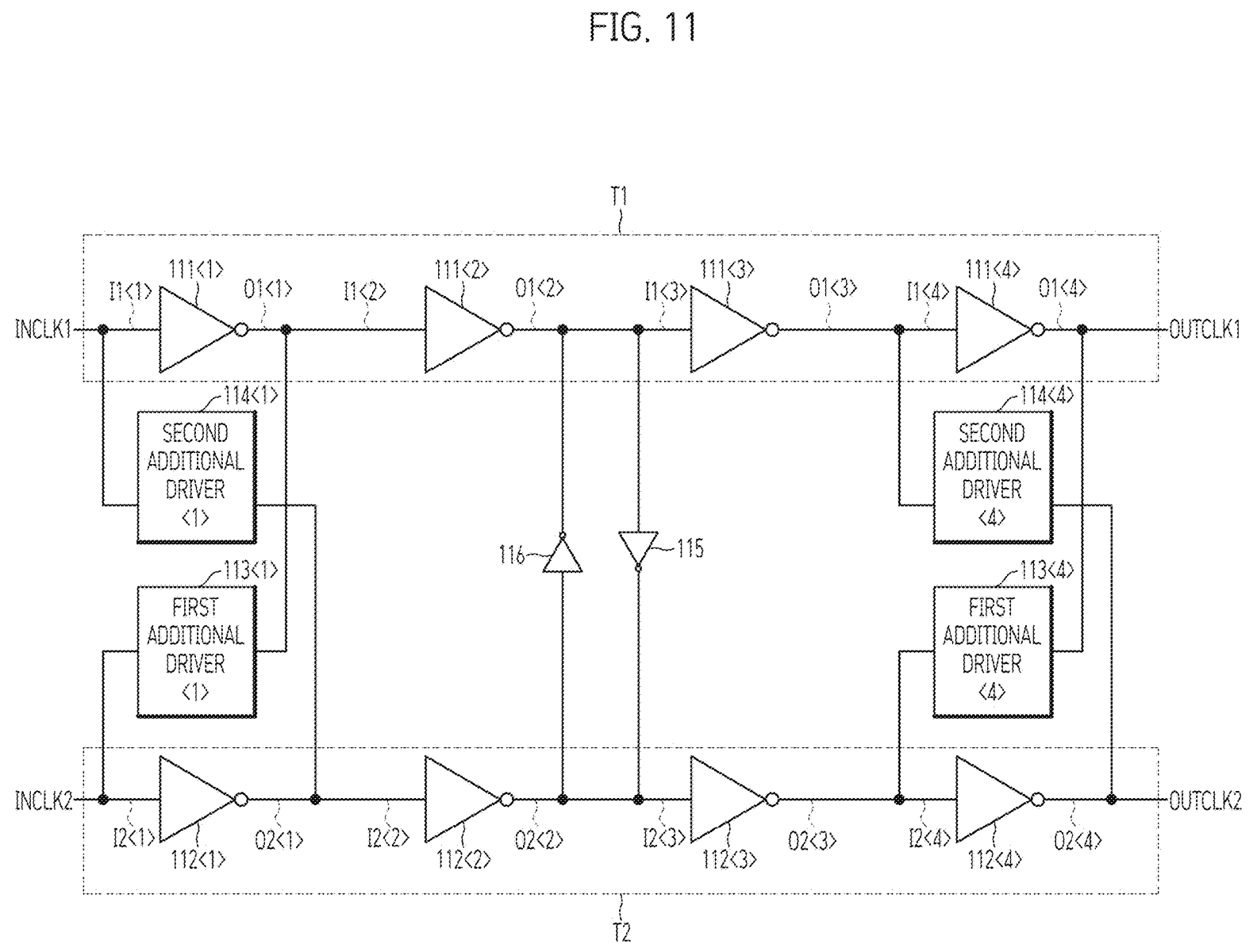

T1
T2
INCLK1
INCLK2
OUTCLK1
OUTCLK2
I1<1> 111<1> O1<1>
I1<2> 111<2> O1<2>
I1<3> 111<3> O1<3>
I1<4> 111<4> O1<4>
I2<1> 112<1> O2<1>
I2<2> 112<2> O2<2>
I2<3> 112<3> O2<3>
I2<4> 112<4> O2<4>
114<1> SECOND ADDITIONAL DRIVER <1>
113<1> FIRST ADDITIONAL DRIVER <1>
114<4> SECOND ADDITIONAL DRIVER <4>
113<4> FIRST ADDITIONAL DRIVER <4>
115
116

CLOCK TRANSMISSION CIRCUIT

CROSS-REFERENCE TO RELATED APPLICATION

This application claims priority under 35 U.S.C. § 119(a) to Korean Patent Application No. 10-2024-0053985, filed on Apr. 23, 2024, the entire contents of which are incorporated herein by reference.

BACKGROUND

1. Field

Embodiments of the present disclosure relate to a semiconductor design, and more particularly, to a clock transmission circuit transmitting differential clock signals.

2. Discussion of the Related Art

Electronic devices may include many electronic components, and among the electronic devices, a computer system may include many semiconductor devices that may communicate with each other by transmitting and receiving clock signals and data. With the recent improvement of the operating speeds of semiconductor devices, the frequency of a clock signal also increases.

Semiconductor devices include a clock distribution network such as a clock tree in order to distribute a clock signal to various internal circuits. The clock tree may supply the clock signal to various circuits inside the semiconductor device by driving the clock signal. However, as the frequency of the clock signal increases and the pulse width of the clock signal decreases, it becomes increasingly difficult to accurately supply the clock signal. Furthermore, there are concerns, such as, the timing at which a clock signal is transmitted may be delayed or a duty cycle error may occur.

SUMMARY

Various embodiments of the present disclosure are directed to providing a clock transmission circuit that minimizes the occurrence of a duty cycle error in a process of transmitting differential clock signals, and a semiconductor device including the clock transmission circuit.

Furthermore, various embodiments of the present disclosure are directed to providing a clock transmission circuit that minimizes a leakage current that is generated in a process of transmitting differential clock signals and a semiconductor device including the clock transmission circuit.

The problems to be solved by the present disclosure are not limited to the above-mentioned problems, and other unmentioned problems will be clearly understood from the following description by those skilled in the art.

In an embodiment of the present disclosure, a clock transmission circuit may include a first inverter configured to inversion-drive a first transmission node in response to a first clock signal, among differential clock signals that are loaded onto a first reception node; a second inverter configured to inversion-drive a second transmission node in response to a second clock signal, among the differential clock signals that are loaded onto a second reception node; a first additional driver configured to additionally drive the first transmission node in response to the second clock signal that is loaded onto the second reception node; and a second additional driver configured to additionally drive the second transmission node in response to the first clock signal that is loaded onto the first reception node.

In an embodiment of the present disclosure, a clock transmission circuit may include a first transmission circuit configured to transmit a first clock signal, among differential clock signals, through a plurality of first inverters that are connected in a chain form; a second transmission circuit configured to transmit a second clock signal, among the differential clock signals, through a plurality of second inverters that are connected in a chain form and that correspond to the plurality of first inverters, respectively; at least one first additional driver configured to additionally drive an output node of at least one second selected inverter corresponding to at least one first selected inverter, among the plurality of first inverters, in response to a signal that is loaded onto an input node of the at least one first selected inverter, among the plurality of second inverters; and at least one second additional driver configured to additionally drive an output node of the at least one first selected inverter in response to a signal that is loaded onto an input node of the at least one second selected inverter.

In the present disclosure, the angle of an edge at which the logic level of a differential clock signal transitions can be aligned to be relatively high, compared to a case in which the differential clock signal is transmitted by using only the inverter, by adding the cross-coupled transistor in which the input node of an inverter that transmits a signal on one side that is included in the differential clock signals is connected to the output node of an inverter that transmits a signal on the other side that is included in the differential clock signals when the differential clock signals are transmitted through the plurality of inverters that are connected in a chain form. Accordingly, the occurrence of a duty cycle error in a process of transmitting the differential clock signals can be minimized.

Furthermore, according to embodiments of the present disclosure a leakage current that is generated in the cross-coupled transistor having a stack structure can be minimized by adding the cross-coupled transistor to the clock transmission circuit that transmits the differential clock signals.

BRIEF DESCRIPTION OF THE DRAWINGS

FIG. 8 is a diagram for describing a clock transmission circuit according to a second embodiment of the present disclosure.

FIG. 10 is a diagram for describing a clock transmission circuit according to a fourth embodiment of the present disclosure.

FIG. 11 is a diagram for describing a clock transmission circuit according to a fifth embodiment of the present disclosure.

DETAILED DESCRIPTION

Figure 1:
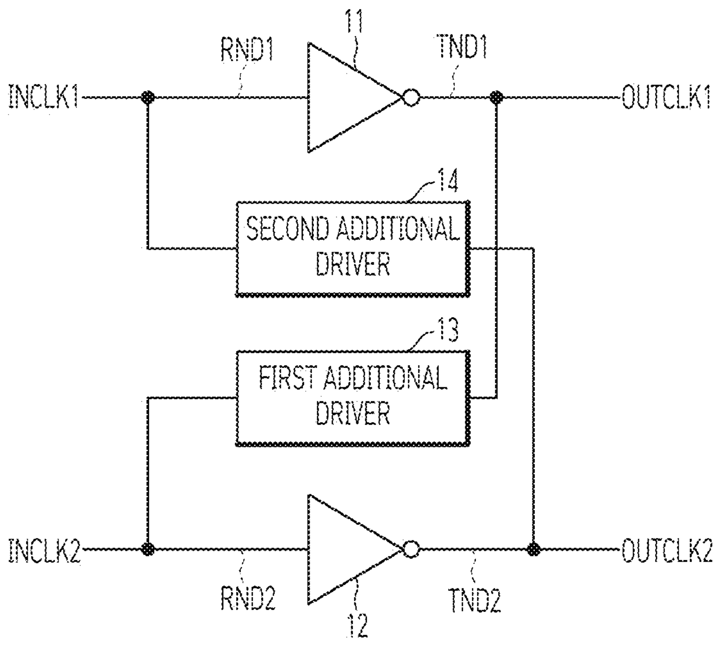
FIG. 1 is a diagram for describing a clock transmission circuit according to a first embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In the present disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In the present disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In the present disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor (s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a diagram for describing a clock transmission circuit according to a first embodiment of the present disclosure.

Referring to FIG. 1, the clock transmission circuit according to the first embodiment of the present disclosure includes a first inverter 11, a second inverter 12, a first additional driver 13, and a second additional driver 14.

For example, the clock transmission circuit is a circuit that transmits differential clock signals INCLK1 and INCLK2 that are toggled at a set frequency within a semiconductor device. In this case, the semiconductor device refers to an individual integrated circuit (IC) chip that has been separated from a semiconductor wafer through the process of sawing. That is, the clock transmission circuit illustrated in the drawings is a circuit that transmits the differential clock signals INCLK1 and INCLK2 within one semiconductor chip or semiconductor die that is physically separated, for example.

In this case, the differential clock signals INCLK1 and INCLK2 include a first clock signal INCLK1 and a second clock signal INCLK2 having opposite phases. The first clock signal INCLK1 and the second clock signal INCLK2 having opposite phases may mean the first clock signal and the second clock signal having opposite logic levels. For example, in a section in which the first clock signal INCLK1 is at a logic "high" level, the second clock signal INCLK2 is at a logic "low" level, for example. In a section in which the first clock signal INCLK1 is at a logic "low" level, the second clock signal INCLK2 is at a logic "high" level, for example.

Specifically, the clock transmission circuit transmits the differential clock signals INCLK1 and INCLK2 in a set transmission direction as OUTCLK1 and OUTCLK2, for example, from a left to right direction in the drawing.

Furthermore, for example, the first inverter 11 inversion-drives a first transmission node TND1 in response to the first clock signal INCLK1, among the differential clock signals INCLK1 and INCLK2 that are loaded onto a first reception node RND1.

Furthermore, for example, the second inverter 12 inversion-drives a second transmission node TND2 in response to the second clock signal INCLK2, among the differential clock signals INCLK1 and INCLK2 that are loaded onto a second reception node RND2.

Furthermore, for example, the first additional driver 13 drives the first transmission node TND1 in response to the second clock signal INCLK2 that is loaded onto the second reception node RND2.

Furthermore, for example, the second additional driver 14 drives the second transmission node TND2 in response to the first clock signal INCLK1 that is loaded onto the first reception node RND1.

The first clock signal INCLK1 that is loaded onto the first reception node RND1 inversion-drives the first transmission node TND1 through the first inverter 11 and simultaneously drives the second transmission node TND2 through the second additional driver 14. Furthermore, the second clock signal INCLK2 that is loaded onto the second reception node RND2 inversion-drives the second transmission node TND2 through the second inverter 12 and simultaneously drives the first transmission node TND1 through the first additional driver 13.

Accordingly, for example, at the first transmission node TND1, the first clock signal INCLK1 that is loaded onto the first reception node RND1 is inverted and driven through the first inverter 11 and simultaneously the second clock signal INCLK2 that is loaded onto the second reception node RND2 may be driven through the first additional driver 13. At this time, the logic level of the first clock signal INCLK1 that is inverted and driven through the first inverter 11 at the first transmission node TND1 and the logic level of the second clock signal INCLK2 that is driven through the first additional driver 13 at the first transmission node TND1 have the same logic level because the first clock signal INCLK1 and the second clock signal INCLK2 are signals having opposite phases.

Likewise, for example, at the second transmission node TND2, the second clock signal INCLK2 that is loaded onto the second reception node RND2 is inverted and driven through the second inverter 12, and simultaneously the first clock signal INCLK1 that is loaded onto the first reception node RND1 is driven through the second additional driver 14. At this time, the logic level of the second clock signal INCLK2 that is inverted and driven through the second inverter 12 at the second transmission node TND2 and the logic level of the first clock signal INCLK1 that is driven through the second additional driver 14 at the second transmission node TND2 have the same logic level because the first clock signal INCLK1 and the second clock signal INCLK2 are signals having opposite phases.

For example, when the first clock signal INCLK1 that is loaded onto the first reception node RND1 is at a logic "high" level, the second clock signal INCLK2 that is loaded onto the second reception node RND2 is at a logic "low" level, for example. In such a case, for example, a signal of the first transmission node TND1 is driven at a logic "low" level through the first inverter 11 and the first additional driver 13, and a signal of the second transmission node TND2 is driven at a logic "high" level through the second inverter 12 and the second additional driver 14.

On the contrary, when the first clock signal INCLK1 that is loaded onto the first reception node RND1 is at a logic "low" level, the second clock signal INCLK2 that is loaded onto the second reception node RND2 is at a logic "high" level, for example. In such a case, for example, a signal of the first transmission node TND1 is driven at a logic "high" level through the first inverter 11 and the first additional driver 13, and a signal of the second transmission node TND2 is driven at a logic "low" level through the second inverter 12 and the second additional driver 14.

The driving force of the first additional driver 13 may be less than the driving force of the first inverter 11. Likewise, the driving force of the second additional driver 14 may be less than the driving force of the second inverter 12. In this case, the driving forces of the first inverter 11 and the second inverter 12 may be the same, and the driving forces of the first additional driver 13 and the second additional driver 14 may be the same.

According to an embodiment, each of the first and second inverters 11 and 12 may be set to have a driving force that is greater by a multiple, among driving forces that are each 4 to 8 times greater than the driving force of each of the first and second additional drivers 13 and 14. For example, the driving force of each of the first and second inverters 11 and 12 may be 4 times greater than the driving force of each of the first and second additional drivers 13 and 14. As another example, the driving force of each of the first and second inverters 11 and 12 may be 8 times greater than the driving force of each of the first and second additional drivers 13 and 14.

As described above, the clock transmission circuit according to the first embodiment of the present disclosure transmits (OUTCLK1) the first clock signal INCLK1 of the differential clock signals INCLK1 and INCLK2 by using the first inverter 11 and the first additional driver 13, and simultaneously transmits (OUTCLK2) the second clock signal INCLK2 by using the second inverter 12 and the second additional driver 14.

Accordingly, the clock transmission circuit according to the first embodiment of the present disclosure can transmit the differential clock signals INCLK1 and INCLK2 as OUTCLK1 and OUTCLK2 by driving forces that are stronger by the driving forces of the first and second additional drivers 13 and 14, compared to a case in which the clock transmission circuit transmits the differential clock signals INCLK1 and INCLK2 as OUTCLK1 and OUTCLK2 by using only the driving forces of the first and second inverters 11 and 12. In this case, transmitting the differential clock signals INCLK1 and INCLK2 by relatively stronger driving forces may mean that the angle of an edge at which the logic level of each of the differential clock signals INCLK1 and INCLK2 transitions is aligned to become relatively high.

The clock transmission circuit according to the first embodiment of the present disclosure can align the angle of an edge at which the logic level of each of the differential clock signals INCLK1 and INCLK2 transitions so that the angle becomes relatively high, by using the driving forces of the first and second additional drivers 13 and 14 along with the driving forces of the first and second inverters 11 and 12 when transmitting the differential clock signals INCLK1 and INCLK2 as OUTCLK1 and OUTCLK2. Accordingly, the occurrence of a duty cycle error in a process of transmitting the differential clock signals INCLK1 and INCLK2 can be minimized.

Figure 2:
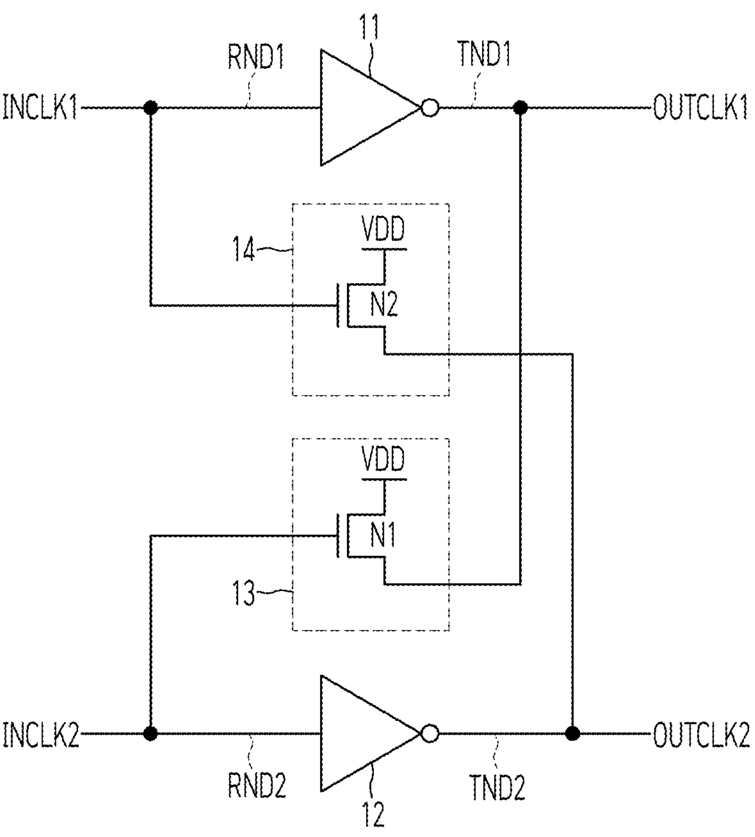
FIG. 2 is a diagram for describing first and second additional drivers, among components of the clock transmission circuit illustrated in FIG. 1.

FIG. 2 is a diagram for describing the first and second additional drivers, among the components of the clock transmission circuit illustrated in FIG. 1.

As may be seen from FIG. 2 in which the same reference numerals as those in FIG. 1 are used, a clock transmission circuit of FIG. 2 has a form in which an example of the circuits of the first and second additional drivers 13 and 14 is embodied in the clock transmission circuit described with reference to FIG. 1.

Specifically, in an embodiment, the first additional driver 13 includes a first NMOS transistor N1 having a gate terminal connected to the second reception node RND2, a drain terminal connected to the first transmission node TND1, and a source terminal connected to a node for a power source voltage VDD.

Accordingly, the first additional driver 13 drives the first transmission node TND1 at the power source voltage VDD corresponding to a logic "high" level, in response to the second clock signal INCLK2, among the differential clock signals INCLK1 and INCLK2 that are loaded onto the second reception node RND2, being at a logic "high" level corresponding to the power source voltage VDD.

In this case, an interval in which the second clock signal INCLK2, among the differential clock signals INCLK1 and INCLK2, is at a logic "high" level corresponding to the power source voltage VDD is the same as an interval in which the first clock signal INCLK1 is at a logic "low" level corresponding to a ground voltage VSS. Accordingly, an interval in which the first inverter 11 inversion-drives the first transmission node TND1 at the power source voltage VDD corresponding to a logic "high" level and an interval in which the first additional driver 13 drives the first transmission node TND1 at the power source voltage VDD corresponding to a logic "high" level may be the same interval.

Particularly, when the first inverter 11 inversion-drives a signal of the first transmission node TND1 from a logic "low" level to a logic "high" level, in response to the first clock signal INCLK1, among the differential clock signals INCLK1 and INCLK2, being at a falling edge at which the first clock signal INCLK1 transitions from a logic "high" level to a logic "low" level, the first additional driver 13 drives the signal of the first transmission node TND1 from a logic "low" level to a logic "high" level, in response to a rising edge at which the second clock signal INCLK2 transitions from a logic "low" level to a logic "high" level.

Accordingly, the signal of the first transmission node TND1 can be raised from a logic "low" level to a logic "high" level, for example, in a form in which the driving force of the first inverter 11 and the driving force of the first additional driver 13 are combined. Accordingly, the angle of a rising edge at which the signal of the first transmission node TND1 is raised from a logic "low" level to a logic "high" level can be aligned to be high compared to the existing case (i.e., a case in which only the driving force of the first inverter is used).

Furthermore, in an embodiment, the second additional driver 14 includes a second NMOS transistor N2 having a gate terminal connected to the first reception node RND1, a drain terminal connected to the second transmission node TND2, and a source terminal connected to the node for the power source voltage VDD.

Accordingly, the second additional driver 14 drives the second transmission node TND2 at the power source voltage VDD corresponding to a logic "high" level, in response to the first clock signal INCLK1, among the differential clock signals INCLK1 and INCLK2 that are loaded onto the first reception node RND1, being at a logic "high" level corresponding to the power source voltage VDD.

In this case, an interval in which the first clock signal INCLK1, among the differential clock signals INCLK1 and INCLK2, is at a logic "high" level corresponding to the power source voltage VDD is the same as an interval in which the second clock signal INCLK2 is at a logic "low" level corresponding to the ground voltage VSS. Accordingly, an interval in which the second inverter 12 inversion-drives the second transmission node TND2 at the power source voltage VDD corresponding to a logic "high" level and an interval in which the second additional driver 14 drives the second transmission node TND2 at the power source voltage VDD corresponding to a logic "high" level may be the same interval.

Particularly, when the second inverter 12 inversion-drives a signal of the second transmission node TND2 from a logic "low" level to a logic "high" level in response to a falling edge at which the second clock signal INCLK2, among the differential clock signals INCLK1 and INCLK2, transitions from a logic "high" level to a logic "low" level, the second additional driver 14 drives the signal of the second transmission node TND2 from a logic "low" level to a logic "high" level in response to a rising edge at which the first clock signal INCLK1 transitions from a logic "low" level to a logic "high" level.

Accordingly, the signal of the second transmission node TND2 can be raised from a logic "low" level to a logic "high" level, for example, in a form in which the driving force of the second inverter 12 and the driving force of the second additional driver 14 are combined. Accordingly, the angle of a rising edge at which the signal of the second transmission node TND2 is raised from a logic "low" level to a logic "high" level can be aligned to be high compared to the existing case (i.e., a case in which only the driving force of the second inverter is used).

Figure 3:
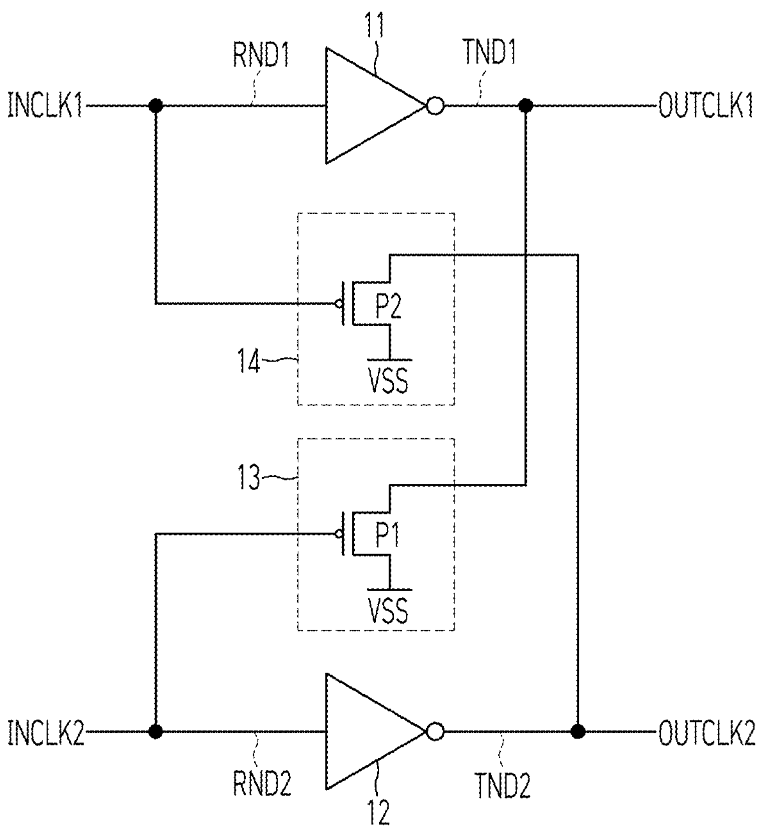
FIG. 3 is a diagram for describing another embodiment of the first and second additional drivers, among the components of the clock transmission circuit illustrated in FIG. 1.

FIG. 3 is a diagram for describing another embodiment of the first and second additional drivers, among the components of the clock transmission circuit illustrated in FIG. 1.

As may be seen from FIG. 3 in which the same reference numerals as those in FIG. 1 are used, a clock transmission circuit of FIG. 3 has a form in which another example of the circuits of the first and second additional drivers 13 and 14 is embodied in the clock transmission circuit described with reference to FIG. 1.

Specifically, in an embodiment, the first additional driver 13 includes a first PMOS transistor P1 having a gate terminal connected to the second reception node RND2, a source terminal connected to the first transmission node TND1, and a drain terminal connected to a node for a ground voltage VSS.

Accordingly, the first additional driver 13 drives the first transmission node TND1 at the ground voltage VSS corresponding to a logic "low" level, in response to the second clock signal INCLK2, among the differential clock signals INCLK1 and INCLK2 that are loaded onto the second reception node RND2, being at a logic "low" level corresponding to the ground voltage VSS.

In this case, an interval in which the second clock signal INCLK2, among the differential clock signals INCLK1 and INCLK2, is at a logic "low" level corresponding to the ground voltage VSS is the same as an interval in which the first clock signal INCLK1 is at a logic "high" level corresponding to the power source voltage VDD. Accordingly, an interval in which the first inverter 11 inversion-drives the first transmission node TND1 at the ground voltage VSS corresponding to a logic "low" level and an interval in which the first additional driver 13 drives the first transmission node TND1 at the ground voltage VSS corresponding to a logic "low" level may be the same interval.

Particularly, when the first inverter 11 inversion-drives a signal of the first transmission node TND1 from a logic "high" level to a logic "low" level in response to a rising edge at which the first clock signal INCLK1, among the differential clock signals INCLK1 and INCLK2, transitions from a logic "low" level to a logic "high" level, the first additional driver 13 drives the signal of the first transmission node TND1 from a logic "high" level to a logic "low" level, in response to a falling edge at which the second clock signal INCLK2 transitions from a logic "high" level to a logic "low" level.

Accordingly, the signal of the first transmission node TND1 can be dropped from a logic "high" level to a logic "low" level, for example, in a form in which the driving force of the first inverter 11 and the driving force of the first additional driver 13 are combined. Accordingly, the angle of a falling edge at which the signal of the first transmission node TND1 is dropped from a logic "high" level to a logic "low" level can be aligned to be high compared to the existing case (i.e., a case in which only the driving force of the first inverter is used).

Furthermore, in an embodiment, the second additional driver 14 includes a second PMOS transistor P2 having a gate terminal connected to the first reception node RND1, a source terminal connected to the second transmission node TND2, and a drain terminal connected to the node for the ground voltage VSS.

Accordingly, the second additional driver 14 drives the second transmission node TND2 at the ground voltage VSS corresponding to a logic "low" level, in response to the first clock signal INCLK1, among the differential clock signals INCLK1 and INCLK2 that are loaded onto the first reception node RND1, being at a logic "low" level corresponding to the ground voltage VSS.

In this case, an interval in which the first clock signal INCLK1, among the differential clock signals INCLK1 and INCLK2, is at a logic "low" level corresponding to the ground voltage VSS is the same as an interval in which the second clock signal INCLK2 is at a logic "high" level corresponding to the power source voltage VDD. Accordingly, an interval in which the second inverter 12 inversion-drives the second transmission node TND2 at the ground voltage VSS corresponding to a logic "low" level and an interval in which the second additional driver 14 drives the second transmission node TND2 at the ground voltage VSS corresponding to a logic "low" level may be the same interval.

Particularly, when the second inverter 12 inversion-drives a signal of the second transmission node TND2 from a logic "high" level to a logic "low" level in response to a rising edge at which the second clock signal INCLK2, among the differential clock signals INCLK1 and INCLK2, transitions from a logic "low" level to a logic "high" level, the second additional driver 14 drives the second transmission node TND2 from a logic "high" level to a logic "low" level in response to a falling edge at which the first clock signal INCLK1 transitions from a logic "high" level to a logic "low" level.

Accordingly, the signal of the second transmission node TND2 can be dropped from a logic "high" level to a logic "low" level, for example, in a form in which the driving force of the second inverter 12 and the driving force of the second additional driver 14 are combined. Accordingly, the angle of a falling edge at which the signal of the second transmission node TND2 is dropped from a logic "high" level to a logic "low" level can be aligned to be high compared to the existing case (i.e., a case in which only the driving force of the second inverter is used).

Figure 4:
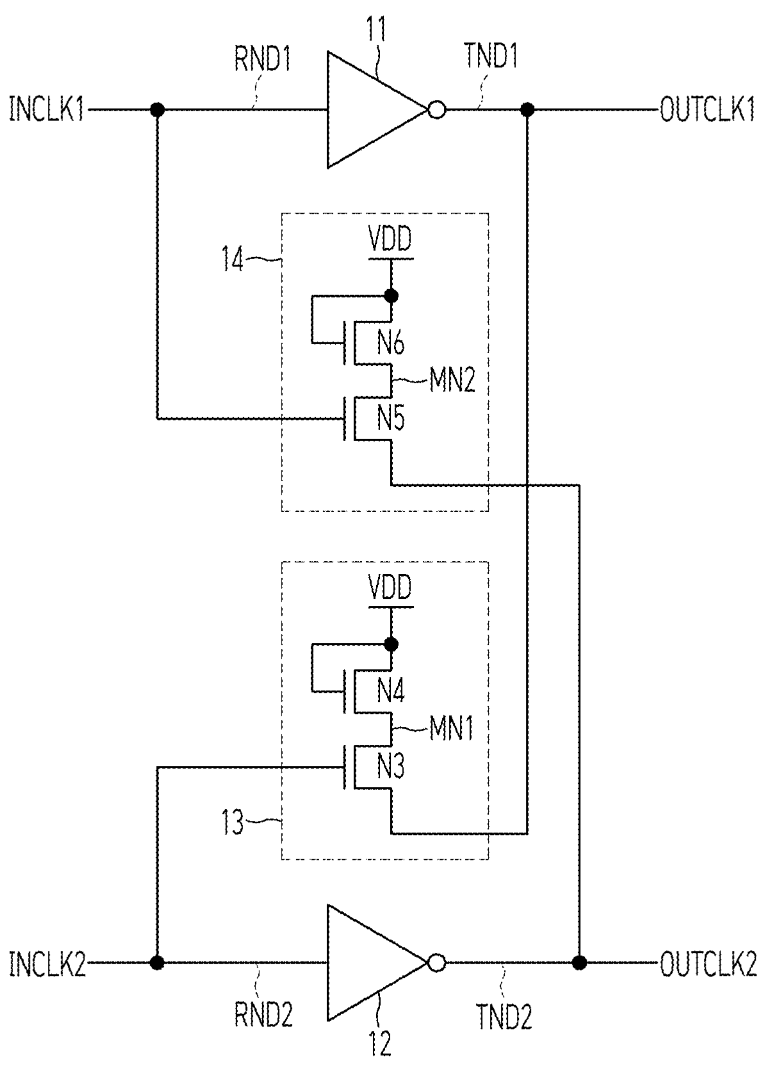
FIG. 4 is a diagram for describing a still another embodiment of the first and second additional drivers, among the components of the clock transmission circuit illustrated in FIG. 1.

FIG. 4 is a diagram for describing a still another embodiment of the first and second additional drivers, among the components of the clock transmission circuit illustrated in FIG. 1.

As may be seen from FIG. 4 in which the same reference numerals as those in FIG. 1 are used, a clock transmission circuit of FIG. 4 has a form in which still another example of the circuits of the first and second additional drivers 13 and 14 is embodied in the clock transmission circuit described with reference to FIG. 1.

Specifically, in an embodiment, the first additional driver 13 includes a third NMOS transistor N3 having a gate terminal connected to the second reception node RND2, a drain terminal connected to the first transmission node TND1, and a source terminal connected to a first middle node MN1 and a fourth NMOS transistor N4 having a gate terminal and a source terminal connected to a node for a power source voltage VDD and a drain terminal connected to the first middle node MN1.

In this case, the third NMOS transistor N3 that is included in the first additional driver 13 corresponds to the first NMOS transistor N1 that is included in the first additional driver 13 described with reference to FIG. 2, for example. That is, the first additional driver 13 disclosed in FIG. 4 may be considered to have a form in which the fourth NMOS transistor N4 is further connected between the source terminal of the first NMOS transistor N1 and the node for the power source voltage VDD, which are included in the first additional driver 13 described with reference to FIG. 2.

In this case, the fourth NMOS transistor N4 that is included in the first additional driver 13 has the gate terminal and the source terminal connected to the node for the power source voltage VDD, and functions as a diode, for example. Accordingly, the size of a standby current that is consumed in an operation process of the first additional driver 13 can be minimized.

The operation of the first additional driver 13 disclosed in FIG. 4 is substantially the same as the operation of the first additional driver 13 described with reference to FIG. 2, for example. However, the first additional driver 13 disclosed in FIG. 4 is in the state in which the internal circuits are constructed in a form in which the size of the standby current that is consumed compared to the first additional driver 13 described with reference to FIG. 2, that is, the size of a current that leaks due to the presence of the first additional driver 13, can be minimized, for example.

Accordingly, the first additional driver 13 disclosed in FIG. 4 drives the first transmission node TND1 at the power source voltage VDD corresponding to a logic "high" level, in response to the second clock signal INCLK2, among the differential clock signals INCLK1 and INCLK2 that are loaded onto the second reception node RND2, being at a logic "high" level corresponding to the power source voltage VDD.

Accordingly, a signal of the first transmission node TND1 can be raised from a logic "low" level to a logic "high" level, for example, in a form in which the driving force of the first inverter 11 and the driving force of the first additional driver 13 are combined. Accordingly, the angle of a rising edge at which the signal of the first transmission node TND1 is raised from a logic "low" level to a logic "high" level can be aligned to be high compared to the existing case (i.e., a case in which only the driving force of the first inverter is used).

Furthermore, in an embodiment, the second additional driver 14 includes a fifth NMOS transistor N5 having a gate terminal connected to the first reception node RND1, a drain terminal connected to the second transmission node TND2, and a source terminal connected to a second middle node MN2, and a sixth NMOS transistor N6 having a gate terminal and a source terminal connected to the node for the power source voltage VDD and a drain terminal connected to the second middle node MN2.

In this case, the fifth NMOS transistor N5 that is included in the second additional driver 14 corresponds to the second NMOS transistor N2 that is included in the second additional driver 14 described with reference to FIG. 2, for example. That is, the second additional driver 14 disclosed in FIG. 4 may be considered to have a form in which the sixth NMOS transistor N6 is further connected between the source terminal of the second NMOS transistor N2 and the node for the power source voltage VDD, which are included in the second additional driver 14 described with reference to FIG. 2.

In this case, the sixth NMOS transistor N6 that is included in the second additional driver 14 has the gate terminal and the source terminal connected to the node for the power source voltage VDD, and functions as a diode, for example. Accordingly, the size of a standby current that is consumed in an operation process of the second additional driver 14 can be minimized.

The operation of the second additional driver 14 disclosed in FIG. 4 is substantially the same as the operation of the second additional driver 14 described with reference to FIG. 2, for example. However, the second additional driver 14 disclosed in FIG. 4 is in the state in which the internal circuits are constructed in a form in which the size of the standby current that is consumed compared to the second additional driver 14 described with reference to FIG. 2, that is, the size of a current that leaks due to the presence of the second additional drivers 14, can be minimized, for example.

Accordingly, the second additional driver 14 disclosed in FIG. 4 drives the second transmission node TND2 at the power source voltage VDD corresponding to a logic "high" level, in response to the first clock signal INCLK1, among the differential clock signals INCLK1 and INCLK2 that are loaded onto the first reception node RND1, being at a logic "high" level corresponding to the power source voltage VDD.

Accordingly, a signal of the second transmission node TND2 can be raised from a logic "low" level to a logic "high" level, for example, in a form in which the driving force of the second inverter 12 and the driving force of the second additional driver 14 are combined. Accordingly, the angle of a rising edge at which the signal of the second transmission node TND2 is raised from a logic "low" level to a logic "high" level can be aligned to be high compared to the existing case (i.e., a case in which only the driving force of the second inverter is used).

Figure 5:
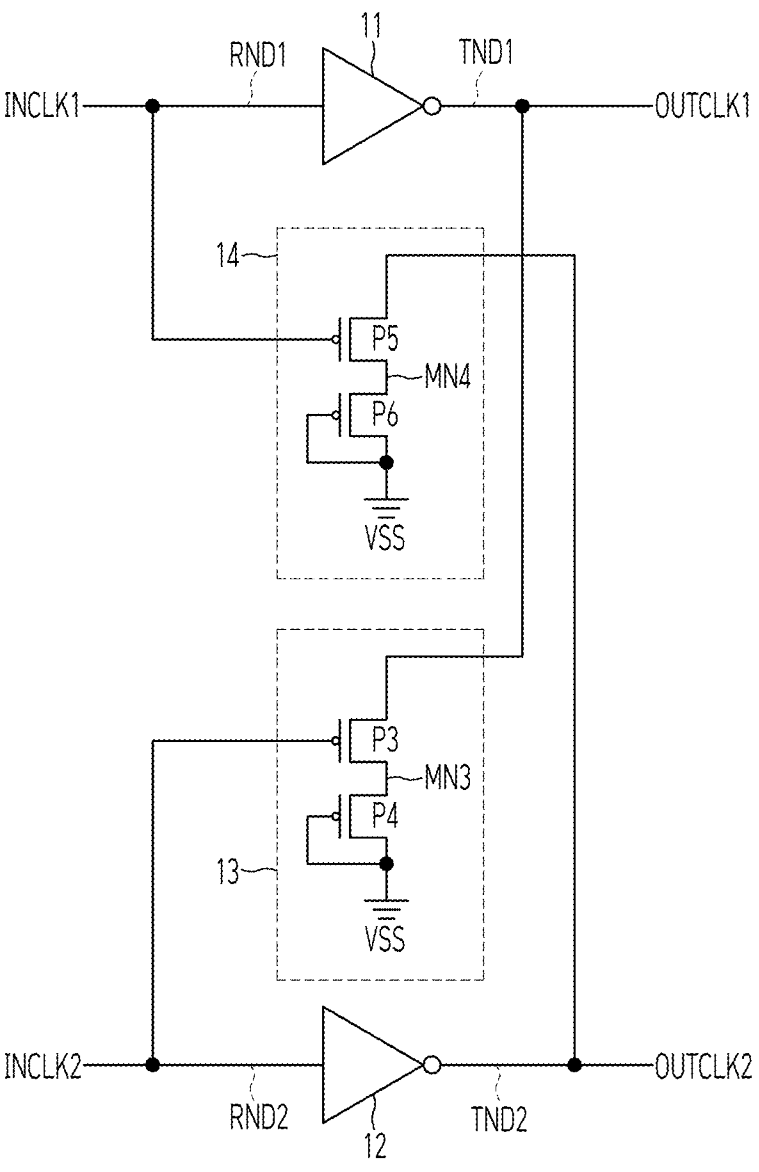
FIG. 5 is a diagram for describing a still another embodiment of the first and second additional drivers, among the components of the clock transmission circuit illustrated in FIG. 1.

FIG. 5 is a diagram for describing a still another embodiment of the first and second additional drivers, among the components of the clock transmission circuit illustrated in FIG. 1.

As may be seen from FIG. 5 in which the same reference numerals as those in FIG. 1 are used, a clock transmission circuit of FIG. 5 has a form in which a still another example of the circuits of the first and second additional drivers 13 and 14 is embodied in the clock transmission circuit described with reference to FIG. 1.

Specifically, in an embodiment, the first additional driver 13 includes a third PMOS transistor P3 having a gate terminal connected to the second reception node RND2, a source terminal connected to the first transmission node TND1, and a drain terminal connected to a third middle node MN3, and a fourth PMOS transistor P4 having a gate terminal and a drain terminal connected to a node for a ground voltage VSS and a source terminal connected to the third middle node MN3.

In this case, the third PMOS transistor P3 that is included in the first additional driver 13 corresponds to the first PMOS transistor P1 that is included in the first additional driver 13 described with reference to FIG. 3, for example. That is, the first additional driver 13 disclosed in FIG. 5 may be considered to have a form in which the fourth PMOS transistor P4 is further connected between the drain terminal of the first PMOS transistor P1 and the node for the ground voltage VSS, which are included in the first additional driver 13 described with reference to FIG. 3.

In this case, the fourth PMOS transistor P4 that is included in the first additional driver 13 has the gate terminal and the drain terminal connected to the node for the ground voltage VSS, and functions as a diode, for example. Accordingly, the size of a standby current that is consumed in an operation process of the first additional driver 13 can be minimized.

The operation of the first additional driver 13 disclosed in FIG. is substantially the same as the operation of the first additional driver 13 described with reference to FIG. 3, for example. However, the first additional driver 13 disclosed in FIG. 5 is in the state in which the internal circuits are constructed in a form in which the size of a standby current that is consumed compared to the first additional driver 13 described with reference to FIG. 3, that is, the size of a current that leaks due to the presence of the first additional driver 13, can be minimized, for example.

Accordingly, the first additional driver 13 disclosed in FIG. 5 drives the first transmission node TND1 at the ground voltage VSS corresponding to a logic "low" level, in response to the second clock signal INCLK2, among the differential clock signals INCLK1 and INCLK2 that are loaded onto the second reception node RND2, being at a logic "low" level corresponding to the ground voltage VSS.

Accordingly, a signal of the first transmission node TND1 can be dropped from a logic "high" level to a logic "low" level, for example, in a form in which the driving force of the first inverter 11 and the driving force of the first additional driver 13 are combined. Accordingly, the angle of a falling edge at which the signal of the first transmission node TND1 is dropped from a logic "high" level to a logic "low" level can be aligned to be high compared to the existing case (i.e., a case in which only the driving force of the first inverter is used).

Furthermore, in an embodiment, the second additional driver 14 includes a fifth PMOS transistor P5 having a gate terminal connected to the first reception node RND1, a source terminal connected to the second transmission node TND2, a drain terminal connected to a fourth middle node MN4, and a sixth PMOS transistor P6 having a gate terminal and a drain terminal connected to the node for the ground voltage VSS and a source terminal connected to the fourth middle node MN4.

In this case, the fifth PMOS transistor P5 that is included in the second additional driver 14 corresponds to the second PMOS transistor P2 that is included in the second additional driver 14 described with reference to FIG. 3, for example. That is, the second additional driver 14 disclosed in FIG. 5 may be considered to have a form in which the sixth PMOS transistor P6 is further connected between the drain terminal of the second PMOS transistor P2 and the node for the ground voltage VSS, which are included in the second additional driver 14 described with reference to FIG. 3.

In this case, the sixth PMOS transistor P6 that is included in the second additional driver 14 has the gate terminal and the drain terminal connected to the node for the ground voltage VSS, and functions as a diode, for example. Accordingly, the size of a standby current that is consumed in an operation process of the second additional driver 14 can be minimized.

An operation of the second additional driver 14 disclosed in FIG. is substantially the same as the operation of the second additional driver 14 described with reference to FIG. 3, for example. However, the second additional driver 14 disclosed in FIG. 5 is in the state in which the internal circuits are constructed in a form in which the size of a standby current that is consumed compared to the second additional driver 14 described with reference to FIG. 3, that is, the size of a current that leaks due to the presence of the second additional driver 14, can be minimized, for example.

Accordingly, the second additional driver 14 disclosed in FIG. 5 drives the second transmission node TND2 at the ground voltage VSS corresponding to a logic "low" level, in response to the first clock signal INCLK1, among the differential clock signals INCLK1 and INCLK2 that are loaded onto the first reception node RND1, being at a logic "low" level corresponding to the ground voltage VSS.

Accordingly, a signal of the second transmission node TND2 can be dropped from a logic "high" level to a logic "low" level, for example, in a form in which the driving force of the second inverter 12 and the driving force of the second additional driver 14 are combined. Accordingly, the angle of a falling edge at which the second transmission node TND2 is dropped from a logic "high" level to a logic "low" level can be aligned to be high compared to the existing case (i.e., a case in which only the driving force of the second inverter is used).

Figure 6:
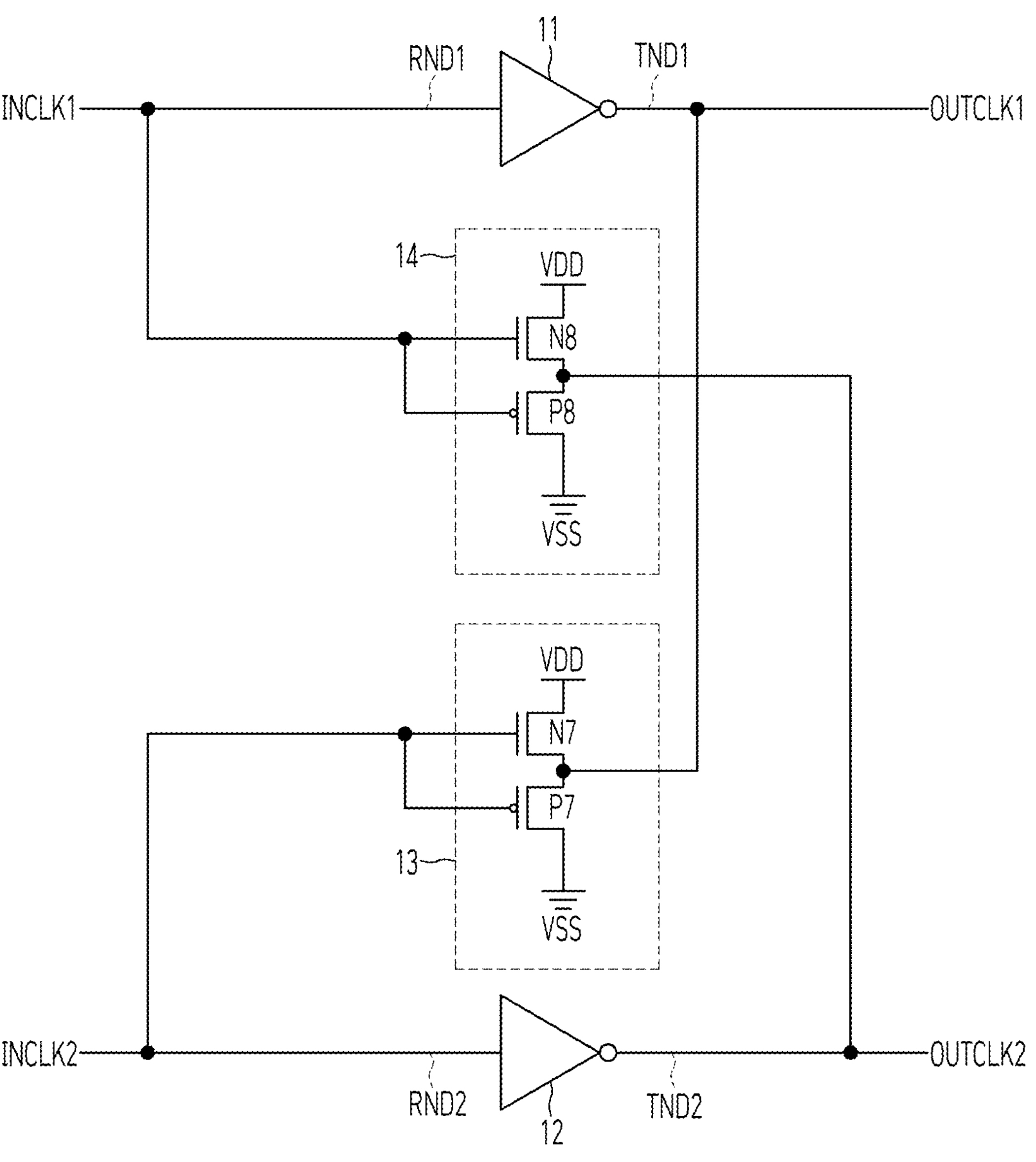
FIG. 6 is a diagram for describing a still another embodiment of the first and second additional drivers, among the components of the clock transmission circuit illustrated in FIG. 1.

FIG. 6 is a diagram for describing a still another embodiment of the first and second additional drivers, among the components of the clock transmission circuit illustrated in FIG. 1.

As may be seen from FIG. 6 in which the same reference numerals as those in FIG. 1 are used, a clock transmission circuit of FIG. 6 has a form in which a still another example of the circuits of the first and second additional drivers 13 and 14 is embodied in the clock transmission circuit described with reference to FIG. 1.

Specifically, in an embodiment, the first additional driver 13 includes a seventh NMOS transistor N7 having a gate terminal connected to the second reception node RND2, a drain terminal connected to the first transmission node TND1, and a source terminal connected to a node for a power source voltage VDD, and a seventh PMOS transistor P7 having a gate terminal connected to the second reception node RND2, a source terminal connected to the first transmission node TND1, and a drain terminal connected to a node for a ground voltage VSS.

Accordingly, the first additional driver 13 drives the first transmission node TND1 at the power source voltage VDD corresponding to a logic "high" level, in response to the second clock signal INCLK2, among the differential clock signals INCLK1 and INCLK2 that are loaded onto the second reception node RND2, being at a logic "high" level corresponding to the power source voltage VDD. Furthermore, the first additional driver 13 drives the first transmission node TND1 at the ground voltage VSS corresponding to a logic "low" level, in response to the second clock signal INCLK2, among the differential clock signals INCLK1 and INCLK2 that are loaded onto the second reception node RND2, being at a logic "low" level corresponding to the ground voltage VSS.

In this case, an interval in which the second clock signal INCLK2, among the differential clock signals INCLK1 and INCLK2, is at a logic "high" level corresponding to the power source voltage VDD is the same as an interval in which the first clock signal INCLK1 is at a logic "low" level corresponding to the ground voltage VSS. Accordingly, an interval in which the first inverter 11 inversion-drives the first transmission node TND1 at the power source voltage VDD corresponding to a logic "high" level and an interval in which the first additional driver 13 drives the first transmission node TND1 at the power source voltage VDD corresponding to a logic "high" level may be the same interval. Furthermore, an interval in which the second clock signal INCLK2, among the differential clock signals INCLK1 and INCLK2, is at a logic "low" level corresponding to the ground voltage VSS is the same as an interval in which the first clock signal INCLK1 is at a logic "high" level corresponding to the power source voltage VDD. Accordingly, an interval in which the first inverter 11 inversion-drives the first transmission node TND1 at the ground voltage VSS corresponding to a logic "low" level and an interval in which the first additional driver 13 drives the first transmission node TND1 at the ground voltage VSS corresponding to a logic "low" level may be the same interval.

Particularly, when the first inverter 11 inversion-drives a signal of the first transmission node TND1 from a logic "low" level to a logic "high" level in response to a falling edge at which the first clock signal INCLK1, among the differential clock signals INCLK1 and INCLK2, transitions from a logic "high" level to a logic "low" level, the first additional driver 13 drives the signal of the first transmission node TND1 from a logic "low" level to a logic "high" level in response to a rising edge at which the second clock signal INCLK2 transitions from a logic "low" level to a logic "high" level. Furthermore, when the first inverter 11 inversion-drives the signal of the first transmission node TND1 from a logic "high" level to a logic "low" level in response to a rising edge at which the first clock signal INCLK1, among the differential clock signals INCLK1 and INCLK2, transitions from a logic "low" level to a logic "high" level, the first additional driver 13 drives the signal of the first transmission node TND1 from a logic "high" level to a logic "low" level in response to a falling edge at which the second clock signal INCLK2 transitions from a logic "high" level to a logic "low" level.

Accordingly, the signal of the first transmission node TND1 may be raised from a logic "low" level to a logic "high" level or dropped from a logic "high" level to a logic "low" level, for example, in a form in which the driving force of the first inverter 11 and the driving force of the first additional driver 13 are combined. Accordingly, the angle of a rising edge at which the first transmission node TND1 is raised from a logic "low" level to a logic "high" level and the angle of a falling edge at which the first transmission node TND1 is dropped from a logic "high" level to a logic "low" level can be aligned to be high compared to the existing case (i.e., a case in which only the driving force of the first inverter is used).

Furthermore, in an embodiment, the second additional driver 14 includes an eighth NMOS transistor N8 having a gate terminal connected to the first reception node RND1, a drain terminal connected to the second transmission node TND2, and a source terminal connected to the node for the power source voltage VDD, and an eighth PMOS transistor P8 having a gate terminal connected to the first reception node RND1, a source terminal connected to the second transmission node TND2, and a drain terminal connected to the node for the ground voltage VSS.

Accordingly, the second additional driver 14 drives the second transmission node TND2 at the power source voltage VDD corresponding to a logic "high" level, in response to the first clock signal INCLK1, among the differential clock signals INCLK1 and INCLK2 that are loaded onto the first reception node RND1, being at a logic "high" level corresponding to the power source voltage VDD. Furthermore, the second additional driver 14 drives the second transmission node TND2 at the ground voltage VSS corresponding to a logic "low" level, in response to the first clock signal INCLK1, among the differential clock signals INCLK1 and INCLK2 that are loaded onto the first reception node RND1, being at a logic "low" level corresponding to the ground voltage VSS.

In this case, an interval in which the first clock signal INCLK1, among the differential clock signals INCLK1 and INCLK2, is at a logic "high" level corresponding to the power source voltage VDD is the same as an interval in which the second clock signal INCLK2 is at a logic "low" level corresponding to the ground voltage VSS. Accordingly, an interval in which the second inverter 12 inversion-drives the second transmission node TND2 at the power source voltage VDD corresponding to a logic "high" level and an interval in which the second additional driver 14 drives the second transmission node TND2 at the power source voltage VDD corresponding to a logic "high" level may be the same interval. Furthermore, an interval in which the first clock signal INCLK1, among the differential clock signals INCLK1 and INCLK2 is at a logic "low" level corresponding to the ground voltage VSS is the same as an interval in which the second clock signal INCLK2 is at a logic "high" level corresponding to the power source voltage VDD. Accordingly, an interval in which the second inverter 12 inversion-drives the second transmission node TND2 at the ground voltage VSS corresponding to a logic "low" level and an interval in which the second additional driver 14 drives the second transmission node TND2 at the ground voltage VSS corresponding to a logic "low" level may be the same interval.

Particularly, when the second inverter 12 inversion—drives a signal of the second transmission node TND2 from a logic "low" level to a logic "high" level in response to a falling edge at which the second clock signal INCLK2, among the differential clock signals INCLK1 and INCLK2, transitions from a logic "high" level to a logic "low" level, the second additional driver 14 drives the signal of the second transmission node TND2 from a logic "low" level to a logic "high" level in response to a rising edge at which the first clock signal INCLK1 transitions from a logic "low" level to a logic "high" level. Furthermore, when the second inverter 12 inversion-drives the signal of the second transmission node TND2 from a logic "high" level to a logic "low" level in response to a rising edge at which the second clock signal INCLK2, among the differential clock signals INCLK1 and INCLK2, transitions from a logic "low" level to a logic "high" level, the second additional driver 14 drives the signal of the second transmission node TND2 from a logic "high" level to a logic "low" level in response to a falling edge at which the first clock signal INCLK1 transitions from a logic "high" level to a logic "low" level.

Accordingly, the signal of the second transmission node TND2 can be raised from a logic "low" level to a logic "high" level or dropped from a logic "high" level to a logic "low" level, for example, in a form in which the driving force of the second inverter 12 and the driving force of the second additional driver 14 are combined. Accordingly, the angle of a rising edge at which the signal of the second transmission node TND2 is raised from a logic "low" level to a logic "high" level and the angle of a falling edge at which the signal of the second transmission node TND2 is dropped from a logic "high" level to a logic "low" level can be aligned to be high compared to the existing case (i.e., a case in which only the driving force of the second inverter is used).

Figure 7:
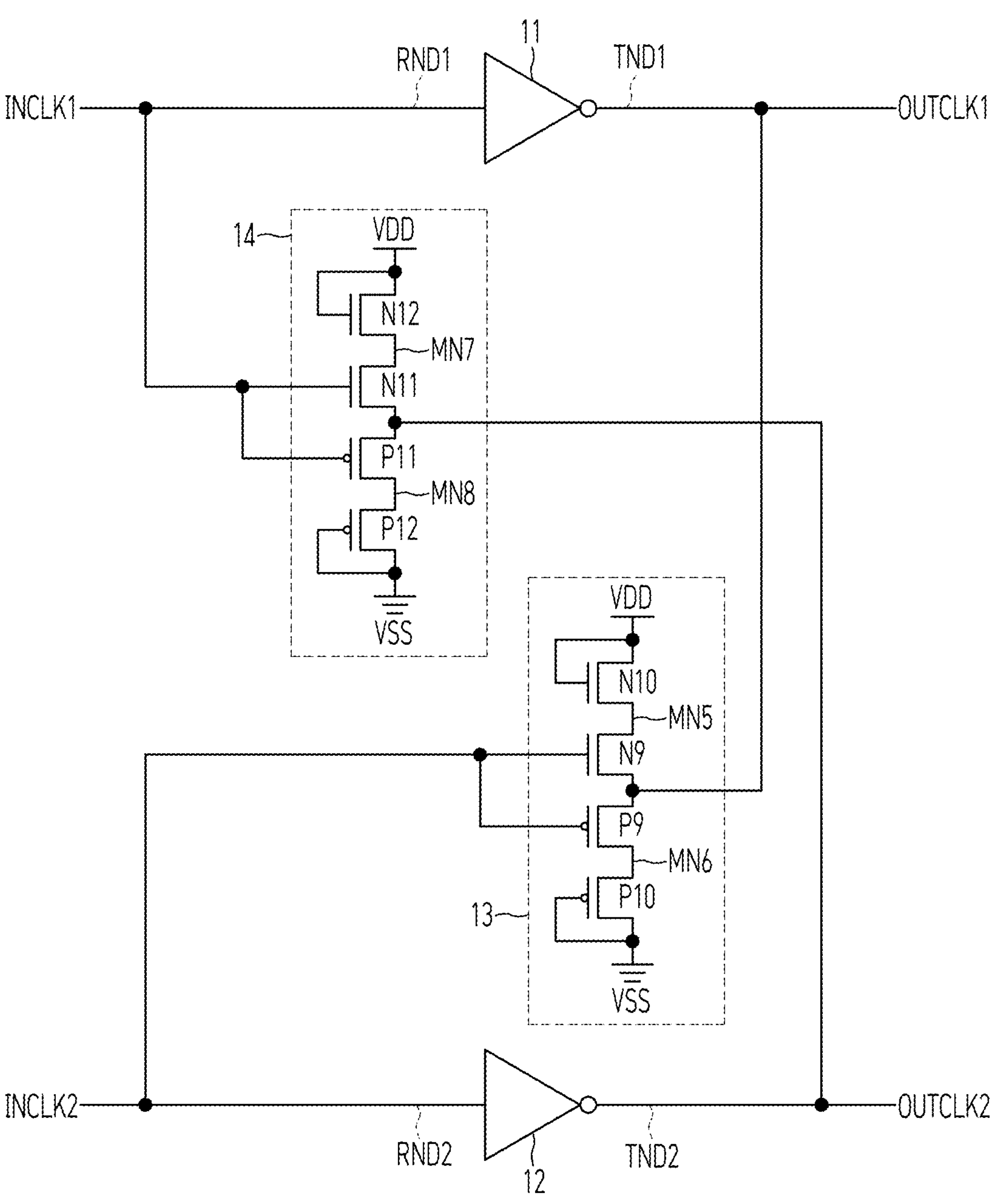
FIG. 7 is a diagram for describing a still another embodiment of the first and second additional drivers, among the components of the clock transmission circuit illustrated in FIG. 1.

FIG. 7 is a diagram for describing a still another embodiment of the first and second additional drivers, among the components of the clock transmission circuit illustrated in FIG. 1.

As may be seen from FIG. 7 in which the same reference numerals as those in FIG. 1 are used, a clock transmission circuit of FIG. 7 has a form in which a still another example of the circuits of the first and second additional drivers 13 and 14 is embodied in the clock transmission circuit described with reference to FIG. 1.

Specifically, in an embodiment, the first additional driver 13 includes a ninth NMOS transistor N9 having a gate terminal connected to the second reception node RND2, a drain terminal connected to the first transmission node TND1, and a source terminal connected to a fifth middle node MN5, a tenth NMOS transistor N10 having a gate terminal and a source terminal connected to a node for a power source voltage VDD and a drain terminal connected to the fifth middle node MN5, a ninth PMOS transistor P9 having a gate terminal connected to the second reception node RND2, a source terminal connected to the first transmission node TND1, and a drain terminal connected to a sixth middle node MN6, and a tenth PMOS transistor P10 having a gate terminal and a drain terminal connected to a node for a ground voltage VSS and a source terminal connected to the sixth middle node MN6.

In this case, the ninth NMOS transistor N9 and the ninth PMOS transistor P9 that are included in the first additional driver 13 correspond to the seventh NMOS transistor N7 and the seventh PMOS transistor P7, respectively, which are included in the first additional driver 13 described with reference to FIG. 6, for example. That is, the first additional driver 13 disclosed in FIG. 7 may be considered to have a form in which the tenth NMOS transistor N10 is further connected between the source terminal of the seventh NMOS transistor N7 and the node for the power source voltage VDD, which are included in the first additional driver 13 described with reference to FIG. 6 and the tenth PMOS transistor P10 is further connected between the drain terminal of the seventh PMOS transistor P7 and the node for the ground voltage VSS, which are included in the first additional driver 13 described with reference to FIG. 6.

In this case, the tenth NMOS transistor N10 that is included in the first additional driver 13 has the gate terminal and the source terminal connected to the node for the power source voltage VDD, and functions as a diode, for example. Furthermore, the tenth PMOS transistor P10 that is included in the first additional driver 13 has the gate terminal and the drain terminal connected to the node for the ground voltage VSS, and functions as a diode, for example. Accordingly, the size of a standby current that is consumed in an operation process of the first additional driver 13 can be minimized.

An operation of the first additional driver 13 disclosed in FIG. 7 is substantially the same as the operation of the first additional driver 13 described with reference to FIG. 6, for example. However, the first additional driver 13 disclosed in FIG. 7 is in the state in which the internal circuits are constructed in a form in which the size of a standby current that is consumed compared to the first additional driver 13 described with reference to FIG. 6, that is, the size of a current that leaks due to the presence of the first additional driver 13, can be minimized, for example.

Accordingly, the first additional driver 13 disclosed in FIG. 7 drives the first transmission node TND1 at the power source voltage VDD corresponding to a logic "high" level in response to the second clock signal INCLK2, among the differential clock signals INCLK1 and INCLK2 that are loaded onto the second reception node RND2, being at a logic "high" level corresponding to the power source voltage VDD, and drives the first transmission node TND1 at the ground voltage VSS corresponding to a logic "low" level in response to the second clock signal INCLK2, among the differential clock signals INCLK1 and INCLK2 that are loaded onto the second reception node RND2, being at a logic "low" level corresponding to the ground voltage VSS.

Accordingly, a signal of the first transmission node TND1 can be raised from a logic "low" level to a logic "high" level or dropped from a logic "high" level to a logic "low" level, for example, in a form in which the driving force of the first inverter 11 and the driving force of the first additional driver 13 are combined. Accordingly, the angle of a rising edge at which the signal of the first transmission node TND1 is raised from a logic "low" level to a logic "high" level and the angle of a falling edge of the signal of the first transmission node TND1 is dropped from a logic "high" level to a logic "low" level can be aligned to be high compared to the existing case (i.e., a case in which only the driving force of the first inverter is used).

Furthermore, in an embodiment, the second additional driver 14 includes an eleventh NMOS transistor N11 having a gate terminal connected to the first reception node RND1, a drain terminal connected to the second transmission node TND2, and a source terminal connected to a seventh middle node MN7, a twelfth NMOS transistor N12 having a gate terminal and a source terminal connected to the node for the power source voltage VDD and a drain terminal connected to the seventh middle node MN7, an eleventh PMOS transistor P11 having a gate terminal connected to the first reception node RND1, a source terminal connected to the second transmission node TND2, and a drain terminal connected to an eighth middle node MN8, and a twelfth PMOS transistor P12 having a gate terminal and a drain terminal connected to the node for the ground voltage VSS and a source terminal connected to the eighth middle node MN8.

In this case, the eleventh NMOS transistor N11 and the eleventh PMOS transistor P11 that are included in the second additional driver 14 correspond to the eighth NMOS transistor N8 and the eighth PMOS transistor P8, respectively, which are included in the second additional driver 14 described with reference to FIG. 6, for example. That is, the second additional driver 14 disclosed in FIG. 7 may be considered to have a form in which the twelfth NMOS transistor N12 is further connected between the source terminal of the eighth NMOS transistor N8 and the node for the power source voltage VDD, which are included in the second additional driver 14 described with reference to FIG. 6, and the twelfth PMOS transistor P12 is further connected between the drain terminal of the eighth PMOS transistor P8 and the node for the ground voltage VSS, which are included in the second additional driver 14 described with reference to FIG. 6.

In this case, the twelfth NMOS transistor N12 that is included in the second additional driver 14 has the gate terminal and the source terminal connected to the node for the power source voltage VDD, and functions as a diode, for example. Furthermore, the twelfth PMOS transistor P12 that is included in the second additional driver 14 has the gate terminal and the drain terminal connected to the node for the ground voltage VSS, and functions as a diode, for example. Accordingly, the size of a standby current that is consumed in an operation process of the second additional driver 14 can be minimized.

An operation of the second additional driver 14 disclosed in FIG. 7 is substantially the same as the operation of the second additional driver 14 described with reference to FIG. 6, for example. However, the second additional driver 14 disclosed in FIG. 7 is in the state in which the internal circuits are constructed in a form in which the size of a standby current that is consumed compared to the second additional driver 14 described with reference to FIG. 6, that is, the size of a current that leaks due to the presence of the second additional drivers 14, can be minimized, for example.

Accordingly, the second additional driver 14 disclosed in FIG. 7 drives the second transmission node TND2 at the power source voltage VDD corresponding to a logic "high" level in response to the first clock signal INCLK1, among the differential clock signals INCLK1 and INCLK2 that are loaded onto the first reception node RND1, being at a logic "high" level corresponding to the power source voltage VDD, and drives the second transmission node TND2 at the ground voltage VSS corresponding to a logic "low" level in response to the first clock signal INCLK1, among the differential clock signals INCLK1 and INCLK2 that are loaded onto the first reception node RND1, being at a logic "low" level corresponding to the ground voltage VSS.

Accordingly, a signal of the second transmission node TND2 can be raised from a logic "low" level to a logic "high" level or dropped from a logic "high" level to a logic "low" level in a form in which the driving force of the first inverter 11 and the driving force of the second additional driver 14 are combined. Accordingly, the angle of a rising edge at which the signal of the second transmission node TND2 is raised from a logic "low" level to a logic "high" level and the angle of a falling edge at which the signal of the second transmission node TND2 is dropped from a logic "high" level to a logic "low" level can be aligned to be high compared to the existing case (i.e., a case in which only the driving force of the second inverter is used).

Figure 8:
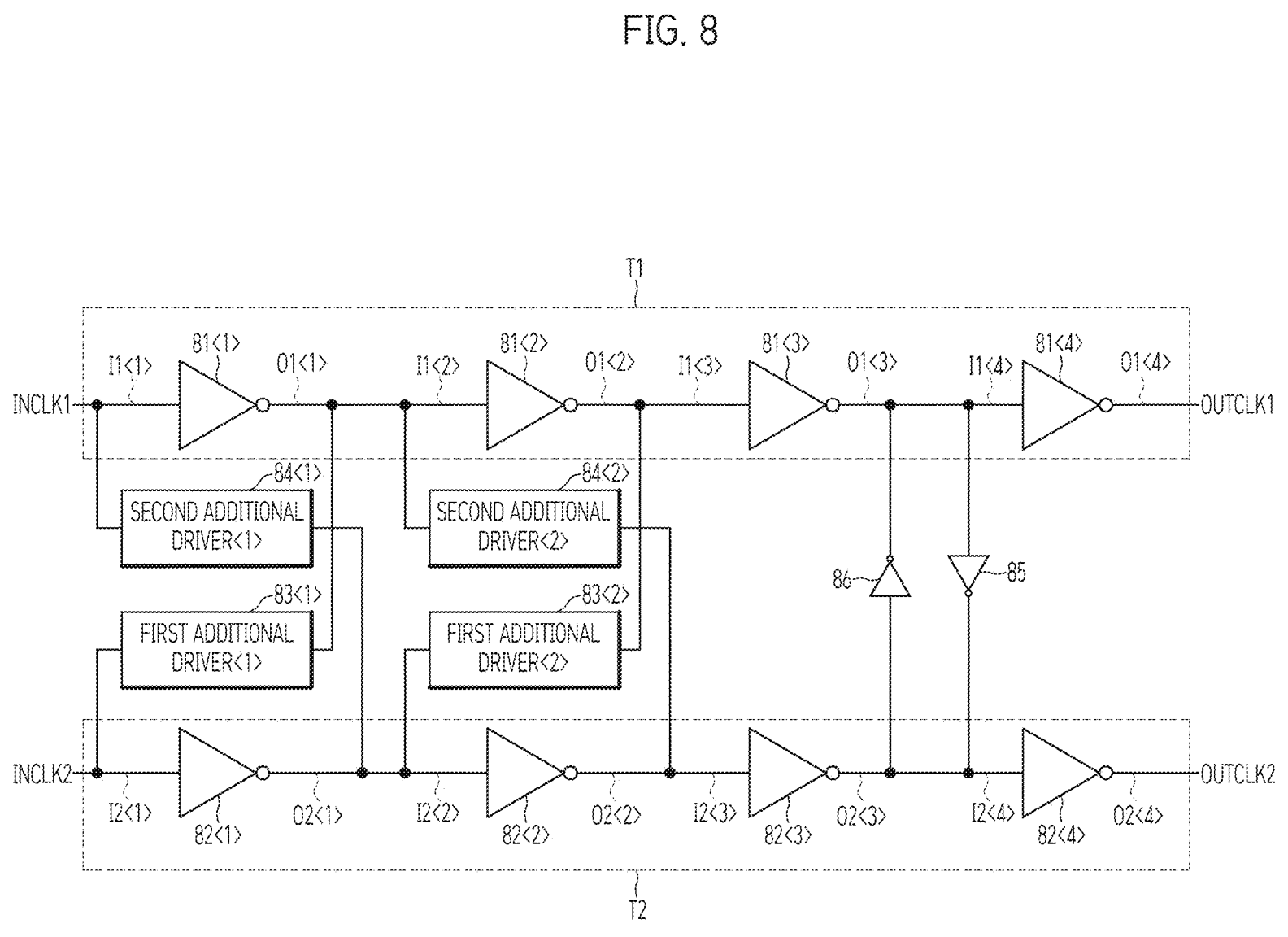

FIG. 8 is a diagram for describing a clock transmission circuit according to a second embodiment of the present disclosure.

Referring to FIG. 8, the clock transmission circuit according to the second embodiment of the present disclosure includes a first transmission circuit T1, a second transmission circuit T2, N first additional drivers 83<1:2>, and N second additional drivers 84<1:2>. In this case, N may be a natural number equal to or greater than 1.

In this case, the clock transmission circuit is a circuit that transmits differential clock signals INCLK1 and INCLK2 that are toggled at a set frequency within a semiconductor device, as described with reference to FIG. 1, for example.

Accordingly, the differential clock signals INCLK1 and INCLK2 includes a first clock signal INCLK1 and a second clock signal INCLK2 having opposite phases.

Furthermore, the first transmission circuit T1 transmits the first clock signal INCLK1, among the differential clock signals INCLK1 and INCLK2, through a plurality of first inverters 81<1:4> that are connected in a chain form (i.e., in series). That is, the first transmission circuit T1 transmits the first clock signal INCLK1 while repeatedly inverting and driving the first clock signal INCLK1 in plural times through the plurality of first inverters 81<1:4> that are connected in a chain form. In this case, the plurality of first inverters 81<1:4> includes input nodes I1<1:4> and output nodes O1<1:4>, respectively, for example. Signals that are transmitted to the input nodes I1<1:2> are inverted and driven to the output nodes O1<1:2>, respectively.

Furthermore, the second transmission circuit T2 transmits the second clock signal INCLK2, among the differential clock signals INCLK1 and INCLK2, through a plurality of second inverters 82<1:4> that are connected in a chain form and that correspond to the plurality of first inverters 81<1:4>, respectively. That is, the second transmission circuit T2 transmits the second clock signal INCLK2 while repeatedly inverting and driving the second clock signal INCLK2 in plural times through the plurality of second inverters 82<1:4> that are connected in a chain form. In this case, the plurality of second inverters 82<1:4> includes input nodes I2<1:4> and output nodes O2<1:4>, respectively. Signals that are transmitted to the input nodes I2<1:2> are inverted and driven to the output nodes O2<1:2>, respectively.

Furthermore, the plurality of first inverters 81<1:4> that are included in the first transmission circuit T1 and the plurality of second inverters 82<1:4> that are included in the second transmission circuit T2 may be disposed in a form in which the plurality of first inverters 81<1:4> and the plurality of second inverters 82<1:4> correspond to each other.

For example, as illustrated in FIG. 8, if the four first inverters 81<1:4> that are connected in a chain form are included in the first transmission circuit T1, the four second inverters 82<1:4> that are connected in a chain form and that correspond to the four first inverters 81<1:4>, respectively, may be included in the second transmission circuit T2.

That is, the first inverter 81<1>, among the plurality of first inverters 81<1:4>, and the first inverter 82<1>, among the plurality of second inverters 82<1:4>, may be considered to be disposed in a way to correspond to each other. Likewise, the second inverter 81<2>, among the plurality of first inverters 81<1:4>, and the second inverter 82<2>, among the plurality of second inverters 82<1:4>, may be considered to be disposed in a way to correspond to each other. Furthermore, the third inverter 81<3>, among the plurality of first inverters 81<1:4>, and the third inverter 82<3>, among the plurality of second inverters 82<1:4>, may be considered to be disposed in a way to correspond to each other. Furthermore, the fourth inverter 81<4>, among the plurality of first inverters 81<1:4>, and the fourth inverter 82<4>, among the plurality of second inverters 82<1:4>, may be considered to be disposed in a way to correspond to each other.

For reference, unlike in the drawing, for example, the first transmission circuit T1 includes the first inverters 81<1:4> having a number greater than or less than 4, and the second transmission circuit T2 also includes the second inverters 82<1:4> having a number greater than or less than 4 in a form in which the second inverters 82<1:4> correspond to the first inverters 81<1:4>. In a subsequent description, the first transmission circuit T1 includes the four first inverters 81<1:4> and the second transmission circuit T2 includes the four second inverters 82<1:4> in a form in which the second inverters 82<1:4> correspond to the first inverters 81<1:4>.

Furthermore, the N first additional drivers 83<1:2> drive the output nodes O1<1:2> of the N second selected inverters 81<1:2> corresponding to the N first selected inverters 82<1:2>, among the plurality of first inverters 81<1:4>, respectively, in response to a signal that is loaded onto different input nodes I2<1:2> of the N first selected inverters 82<1:2>, among the plurality of second inverters 82<1:4>, for example.

Furthermore, the N second additional drivers 84<1:2> drive the output nodes O2<1:2> of the N first selected inverters 82<1:2>, respectively, in response to a signal that is loaded onto different input nodes I1<1:2> of the N second selected inverters 81<1:2>, for example.

In this case, for example, the N first and second additional drivers 83<1:2> and 84<1:2> are disposed in a form in which the N first and second additional drivers 83<1:2> and 84<1:2> correspond to only N first and second selected inverters 82<1:2> and 81<1:2>, respectively, that is, some of the plurality of first and second inverters 81<1:4> and 82<1:4>.

According to an embodiment, only each of the first and second inverters 82<1:2>, among the plurality of second inverters 82<1:4>, may be divided (i.e., determined) as one of the N first selected inverters 82<1:2>, and the remaining third and fourth selected inverters 82<3:4> might not be divided as "first selected inverters". Likewise, only each of the first and second inverters 81<1:2>, among the plurality of first inverters 81<1:4>, may be divided as one of the N second selected inverters 81<1:2>, and the remaining third and fourth selected inverters 81<3:4> might not be divided as "second selected inverters".

More specifically, for example, when the driving force of the first and second inverters 81<one of 1:3> and 82<one of 2:4> in a following order is greater than the driving force of the first and second inverters 81<one of 1:3> and 82<one of 1:3> in a previous order, among the plurality of first and second inverters 81<1:4> and 82<1:4>, the first and second inverters 81<one of 1:3> and 82<one of 1:3> in the previous order are divided as one of the N second and first selected inverters.

Furthermore, for example, when the driving force of the first and second inverters 81<one of 1:3> and 82<one of 2:4> in a following order is greater than the driving force of the first and second inverters 81<one of 1:3> and 82<one of 1:3> in a previous order, among the plurality of first and second inverters 81<1:4> and 82<1:4>, the first and second inverters 81<one of 2:4> and 82<one of 2:4> in the following order are divided as one of the N second and first selected inverters.

Although the driving force of the first and second inverters 81<one of 1:3> and 82<one of 2:4> in the following order is greater than the driving force of the first and second inverters 81<one of 1:3> and 82<one of 1:3> in the previous order, only some of the first and second inverters 81<one of 1:3> and 82<one of 1:3> in the previous order may be divided as "second and first selected inverters", and the remainder might not be divided as the "second and first selected inverters". Likewise, only some of the first and second inverters 81<one of 2:4> and 82<one of 2:4> in the following order may be divided as "second and first selected inverters", and the remainder might not be divided as the "second and first selected inverters". That is, which one of the plurality of first and second inverters 81<1:4> and 82<1:4> will be divided as the "second and first selected inverters" may be different depending on a design's choice.

According to an embodiment, when the driving force of the $2^{nd}$ first and second inverters 81<2> and 82<2>, among the plurality of first and second inverters 81<1:4> and 82<1:4>, is greater than the driving force of the $1^{st}$ first and second inverters 81<1> and 82<1>, the $1^{st}$ first inverter 81<1> may be divided as the $1^{st}$ second selected inverter 81<1>, and the $1^{st}$ second inverter 82<1> may be divided as the $1^{st}$ first selected inverter 82<1>. For example, the driving force of the $1^{st}$ first and second inverters 81<1> and 82<1> is ⅔ of the driving force of the $2^{nd}$ first and second inverters 81<2> and 82<2>.

According to another embodiment, when the driving force of the $3^{rd}$ first and second inverters 81<3> and 82<3>, among the plurality of first and second inverters 81<1:4> and 82<1:4>, is greater than the driving force of the $2^{nd}$ first and second inverters 81<2> and 82<2>, the $2^{nd}$ first inverter 81<2> may be divided as the $2^{nd}$ second selected inverter 81<2>, and the $2^{nd}$ second inverter 82<2> may be divided as the $2^{nd}$ first selected inverter 82<1>. For example, the driving force of the $2^{nd}$ first and second inverters 81<2> and 82<2> is ⅔ of the driving force of the $3^{rd}$ first and second inverters 81<3> and 82<3>.

Furthermore, the clock transmission circuit according to the second embodiment of the present disclosure further includes a third inverter 85 and a fourth inverter 86 in a specific condition, in addition to the first transmission circuit T1, the second transmission circuit T2, the N first additional drivers 83<1:2>, and the N second additional drivers 84<1:2>. Furthermore, for example, when the specific condition is not satisfied, the clock transmission circuit according to the second embodiment of the present disclosure includes only the first transmission circuit T1, the second transmission circuit T2, the N first additional drivers 83<1:2>, and the N second additional drivers 84<1:2>, and does not include the third inverter 85 and the fourth inverter 86. Furthermore, for example, the clock transmission circuit according to the second embodiment of the present disclosure further includes the third inverter 85 and the fourth inverter 86, along with the first transmission circuit T1, the second transmission circuit T2, the N first additional drivers 83<1:2>, and the N second additional drivers 84<1:2>, regardless of whether the specific condition is satisfied. That is, whether the third inverter 85 and the fourth inverter 86 will be further included along with the first transmission circuit T1, the second transmission circuit T2, the N first additional drivers 83<1:2>, and the N second additional drivers 84<1:2> may be different depending on a design's choice.

In this case, the specific condition is a case in which the driving force of the first and second inverters 81<one of 1:3> and 82<one of 1:3> in a previous order, among the plurality of first and second inverters 81<1:4> and 82<1:4>, and the driving force of the first and second inverters 81<one of 1:3> and 82<one of 2:4> in a following order, among the plurality of first and second inverters 81<1:4> and 82<1:4>, are the same. In such a specific condition, the third inverter 85 inversion-drives the output node O2<one of 1:3> of the second inverter 82<one of 1:3> in a previous order, in response to a signal that is loaded onto the output node O1<one of 1:3> of the first inverter 81<one of 1:3> in a previous order. Likewise, in the specific condition, the fourth inverter 86 inversion-drives the output node O1<one of 1:3> of the first inverter 81<one of 1:3> in a previous order, in response to a signal that is loaded onto the output node O2<one of 1:3> of the second inverter 82<one of 1:3> in a previous order.

According to an embodiment, the driving force of the $3^{rd}$ first and second inverters 81<3> and 82<3>, among the plurality of first and second inverters 81<1:4> and 82<1:4>, and the driving force of the $4^{th}$ first and second inverters 81<4> and 82<4>>, among the plurality of first and second inverters 81<1:4> and 82<1:4>, are the same. Accordingly, the clock transmission circuit according to the second embodiment of the present disclosure further includes the third inverter 85 that inversion-drives the output node O2<3> of the $3^{rd}$ second inverter 82<3> in response to a signal that is loaded onto the output node O1<3> of the $3^{rd}$ first inverter 81<3> and the fourth inverter 86 that inversion-drives the output node O1<3> of the $3^{rd}$ first inverter 81<3> in response to a signal that is loaded onto the output node O2<3> of the $3^{rd}$ second inverter 82<3>.

For reference, N may be set as a natural number equal to or greater than 1. In a subsequent description, N is 2 as in the drawing.

Specifically, for example, the $1^{st}$ first additional driver 83<1>, among the two first additional drivers 83<1:2>, drives the output node O1<1> of the $1^{st}$ second selected inverter 81<1>, among the two second selected inverters 81<1:2>, in response to a signal that is loaded onto the input node I2<1> of the $1^{st}$ first selected inverter 82<1>, among the two first selected inverters 82<1:2>.

Furthermore, for example, the $1^{st}$ second additional driver 84<1>, among the two second additional drivers 84<1:2>, drives the output node O2<1> of the $1^{st}$ first selected inverter 82<1>, among the two first selected inverters 82<1:2>, in response to a signal that is loaded onto the input node I1<1> of the $1^{st}$ second selected inverter 81<1>, among the two second selected inverters 81<1:2>.

Furthermore, for example, the $2^{nd}$ first additional driver 83<2>, among the two first additional drivers 83<1:2>, drives the output node O1<2> of the $2^{nd}$ second selected inverter 81<2>, among the two second selected inverters 81<1:2>, in response to a signal that is loaded onto the input node I2<2> of the $2^{nd}$ first selected inverter 82<2>, among the two first selected inverters 82<1:2>.

Furthermore, for example, the $2^{nd}$ second additional driver 84<2>, among the two second additional drivers 84<1:2>, drives the output node O2<2> of the $2^{nd}$ first selected inverter 82<2>, among the two first selected inverters 82<1:2>, in response to a signal that is loaded onto the input node I1<2> of the $2^{nd}$ second selected inverter 81<2>, among the two second selected inverters 81<1:2>.

In this case, for example, the $1^{st}$ first additional driver 83<1>, among the two first additional drivers 83<1:2>, and the $1^{st}$ second additional driver 84<1>, among the two second additional drivers 84<1:2>, correspond to the first additional driver 13 and the second additional driver 14, respectively, which have been described with reference to FIG. 1. Furthermore, for example, the $1^{st}$ first selected inverter 82<1>, among the two first selected inverters 82<1:2>, and the $1^{st}$ second selected inverter 81<1>, among the two second selected inverters 81<1:2>, correspond to the first inverter 11 and the second inverter 12, respectively, which have been described with reference to FIG. 1.

Accordingly, for an embodiment of a detailed circuit of each of the $1^{st}$ first additional driver 83<1>, among the two first additional drivers 83<1:2>, and the $1^{st}$ second additional driver 84<1>, among the two second additional drivers 84<1:2>, reference may be made to the embodiment described with reference to any of FIGS. 2 to 7.

Furthermore, for example, the $2^{nd}$ first additional driver 83<2>, among the two first additional drivers 83<1:2>, and the $2^{nd}$ second additional driver 84<2>, among the two second additional drivers 84<1:2>, correspond to the first additional driver 13 and the second additional driver 14, respectively, which have been described with reference to FIG. 1. Furthermore, the $2^{nd}$ first selected inverter 82<2>, among the two first selected inverters 82<1:2>, and the $2^{nd}$ second selected inverter 81<2>, among the two second selected inverters 81<1:2>, correspond to the first inverter 11 and the second inverter 12, respectively, which have been described with reference to FIG. 1.

Accordingly, for an embodiment of a detailed circuit of each of the $2^{nd}$ first additional driver 83<2>, among the two first additional drivers 83<1:2>, and the $2^{nd}$ second additional driver 84<2>, among the two second additional drivers 84<1:2>, reference may be made to the embodiment described with reference to any one of FIGS. 2 to 7.

According to an embodiment, referring to FIG. 8 along with FIG. 2, the two first additional drivers 83<1:2> include two first NMOS transistor N1 having gate terminals connected to the input nodes I2<1:2> of the two first selected inverters 82<1:2>, respectively, drain terminals connected to the output nodes O2<1:2> of the two second selected inverters 81<1:2>, respectively, and source terminals connected to a node for a power source voltage VDD. Furthermore, the two second additional drivers 84<1:2> include two second NMOS transistor N2 having gate terminals connected to the input nodes I1<1:2> of the two second selected inverters 81<1:2>, respectively, drain terminals connected to the output nodes O1<1:2> of the two first selected inverters 82<1:2>, respectively, and source terminals connected to the node for the power source voltage VDD. For reference, reference may be made to FIG. 2 for detailed operations of each of the two first additional drivers 83<1:2> and each of the two second additional drivers 84<1:2>, and the detailed operations will not be described specifically.

According to an embodiment, referring to FIG. 8 along with FIG. 3, the two first additional drivers 83<1:2> include two first PMOS transistor P1 having gate terminals connected to the input nodes I2<1:2> of the two first selected inverters 82<1:2>, respectively, source terminals connected to the output nodes O1<1:2> of the two second selected inverters 81<1:2>, respectively, and drain terminals connected to a node for a ground voltage VSS. Furthermore, the two second additional drivers 84<1:2> include two second PMOS transistor P2 having gate terminals connected to the input nodes I1<1:2> of the two second selected inverters 81<1:2>, respectively, source terminals connected to the output nodes O2<1:2> of the two first selected inverters 82<1:2>, respectively, and drain terminals connected to a node for a ground voltage VSS. For reference, reference may be made to FIG. 3 for detailed operations of each of the two first additional drivers 83<1:2> and each of the two second additional drivers 84<1:2>, and the detailed operations will not be described specifically.

According to an embodiment, referring to FIG. 8 along with FIG. 4, the two first additional drivers 83<1:2> include two third NMOS transistors N3 having gate terminals connected to the input nodes I2<1:2> of the two first selected inverters 82<1:2>, respectively, drain terminals connected to the output nodes O1<1:2> of the two second selected inverters 81<1:2>, respectively, and source terminals connected to the two first middle nodes MN1, respectively, and two fourth NMOS transistors N4 having gate terminals and source terminals connected to a node for a power source voltage VDD, and drain terminals connected to the two first middle nodes MN1, respectively. Furthermore, the two second additional drivers 84<1:2> include two fifth NMOS transistors N5 having gate terminals connected to the input nodes I1<1:2> of the two second selected inverters 81<1:2>, respectively, drain terminals connected to the output nodes O2<1:2> of the two first selected inverters 82<1:2>, and source terminals connected to two second middle nodes MN2, respectively, and two sixth NMOS transistors N6 having gate terminals and source terminals connected to the node for the power source voltage VDD and drain terminals connected to the two second middle node MN2, respectively. For reference, reference may be made to FIG. 4 for detailed operations of each of the two first additional drivers 83<1:2> and each of the two second additional drivers 84<1:2>, and the detailed operations will not be described specifically.

According to an embodiment, referring to FIG. 8 along with FIG. 5, the two first additional drivers 83<1:2> include two third PMOS transistors P3 having gate terminals connected to the input nodes I2<1:2> of the two first selected inverters 82<1:2>, respectively, source terminals connected to the output nodes O1<1:2> of the two second selected inverters 81<1:2>, and drain terminals connected to two third middle nodes MN3, respectively, and two fourth PMOS transistors P4 having gate terminals and drain terminals connected to a node for a ground voltage VSS and source terminals connected to the two third middle nodes MN3, respectively. Furthermore, the two second additional drivers 84<1:2> include two fifth PMOS transistors P5 having gate terminals connected to the input nodes I1<1:2> of the two second selected inverters 81<1:2>, respectively, source terminals connected to the output nodes O2<1:2> of the two first selected inverters 82<1:2>, respectively, and drain terminals connected to two fourth middle nodes MN4, respectively, and two sixth PMOS transistors P6 having gate terminal and drain terminals connected to the node for the ground voltage VSS and source terminals connected to the two fourth middle nodes MN4, respectively. For reference, reference may be made to FIG. 5 for detailed operations of each of the two first additional drivers 83<1:2> and each of the two second additional drivers 84<1:2>, and the detailed operations will not be described specifically.

According to an embodiment, referring to FIG. 8 along with FIG. 6, the two first additional drivers 83<1:2> include two seventh NMOS transistors N7 having gate terminals connected to the input nodes I2<1:2> of the two first selected inverters 82<1:2>, respectively, drain terminals connected to the output nodes O1<1:2> of the two second selected inverters 81<1:2>, respectively, and source terminals connected to a node for a power source voltage VDD, and two seventh PMOS transistors P7 having gate terminals connected to the input nodes I2<1:2> of the two first selected inverters 82<1:2>, respectively, source terminals connected to the output nodes O1<1:2> of the two second selected inverters 81<1:2>, respectively, and drain terminals connected to a node for a ground voltage VSS. Furthermore, the two second additional drivers 84<1:2> include two eighth NMOS transistors N8 having gate terminals connected to the input nodes I1<1:2> of the two second selected inverters 81<1:2>, respectively, drain terminals connected to the output nodes O2<1:2> of the two first selected inverters 82<1:2>, respectively, and source terminals connected to the node for the power source voltage VDD, and two eighth PMOS transistors P8 having gate terminals connected to the input nodes I1<1:2> of the two second selected inverters 81<1:2>, respectively, source terminals connected to the output nodes O2<1:2> of the two first selected inverters 82<1:2>, and drain terminals connected to the node for the ground voltage VSS. For reference, reference may be made to FIG. 6 for detailed operations of each of the two first additional drivers 83<1:2> and each of the two second additional drivers 84<1:2>, and the detailed operations will not be described specifically.

According to an embodiment, referring to FIG. 8 along with FIG. 7, the two first additional drivers 83<1:2> include two ninth NMOS transistors N9 having gate terminals connected to the input nodes I2<1:2> of the two first selected inverters 82<1:2>, respectively, drain terminals connected to the output nodes O1<1:2> of the two second selected inverters 81<1:2>, respectively, and source terminals connected to two fifth middle nodes MN5, respectively, two tenth NMOS transistor N10 having gate terminals and source terminals connected to a node for a power source voltage VDD and drain terminals connected to the two fifth middle nodes MN5, respectively, two ninth PMOS transistor P9 having gate terminals connected to the input nodes I2<1:2> of the two first selected inverters 82<1:2>, respectively, source terminals connected to the output nodes O1<1:2> of the two second selected inverters 81<1:2>, respectively, and drain terminals connected to two sixth middle nodes MN6, respectively, and two tenth PMOS transistors P10 having gate terminals and drain terminals connected to a node for a ground voltage VSS and source terminals connected to the two sixth middle nodes MN6, respectively. Furthermore, the two second additional drivers 84<1:2> include two eleventh NMOS transistors N11 having gate terminals connected to the input nodes I1<1:2> of the two second selected inverters 81<1:2>, respectively, drain terminals connected to the output nodes O2<1:2> of the two first selected inverters 82<1:2>, and source terminals connected to two seventh middle nodes MN7, respectively, two twelfth NMOS transistors N12 having gate terminals and source terminals connected to the node for the power source voltage VDD and drain terminals connected to the two seventh middle nodes MN7, respectively, two eleventh PMOS transistors P11 having gate terminals connected to the input nodes I1<1:2> of the two second selected inverters 81<1:2>, respectively, source terminals connected to the output nodes O2<1:2> of the two first selected inverters 82<1:2>, respectively, and drain terminals connected to two eighth middle nodes MN8, respectively, and two twelfth PMOS transistors P12 having gate terminals and drain terminals connected to the node for the ground voltage VSS and source terminals connected to the two eighth middle nodes MN8, respectively. For reference, reference may be made to FIG. 7 for detailed operations of each of the two first additional drivers 83<1:2> and each of the two second additional drivers 84<1:2>, and the detailed operations will not be described specifically.

Figure 9:
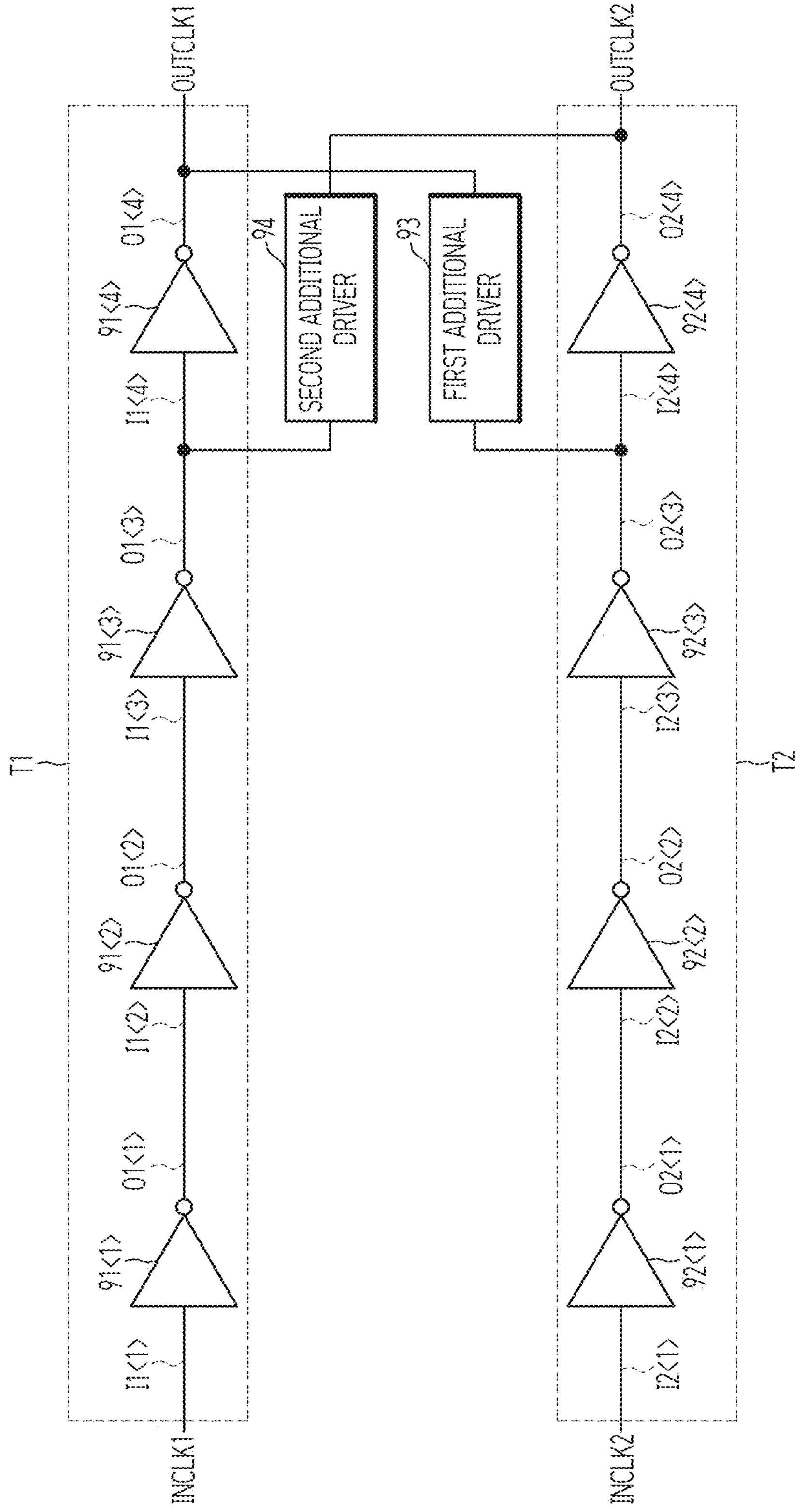
FIG. 9 is a diagram for describing a clock transmission circuit according to a third embodiment of the present disclosure.

FIG. 9 is a diagram for describing a clock transmission circuit according to a third embodiment of the present disclosure.

Referring to FIG. 9, the clock transmission circuit according to the third embodiment of the present disclosure includes a first transmission circuit T1, a second transmission circuit T2, N first additional drivers 93, and N second additional drivers 94. In this case, N may be a natural number equal to or greater than 1.

Specifically, the first transmission circuit T1 transmits a first clock signal INCLK1, among differential clock signals INCLK1 and INCLK2, through a plurality of first inverters 91<1:4> that are connected in a chain form.

Furthermore, the second transmission circuit T2 transmits a second clock signal INCLK2, among the differential clock signals INCLK1 and INCLK2, through a plurality of second inverters 92<1:4> that are connected in a chain form and correspond to the plurality of first inverters 91<1:4>, respectively.

Furthermore, each of the N first additional drivers 93 drives the output node O1<4> of each of the N second selected inverters 91<4> corresponding to the N first selected inverters 92<4>, respectively, among the plurality of first inverters 91<1:4>, in response to a signal that is loaded onto the input node I2<4> of each of the N first selected inverters 92<4>, among the plurality of second inverters 92<1:4>.

Furthermore, each of the N second additional drivers 94 drives the output node O2<4> of each of the N first selected inverters 92<4> in response to a signal that is loaded onto the input node I1<4> of each of the N second selected inverters 91<4>.

It may be seen that the first transmission circuit T1 and the second transmission circuit T2 that are included in the clock transmission circuit according to the third embodiment of the present disclosure correspond to the first transmission circuit T1 and the second transmission circuit T2, respectively, which are included in the clock transmission circuit according to the second embodiment described with reference to FIG. 8. Accordingly, reference may be made to FIG. 8 for detailed constructions and operations of the first transmission circuit T1 and the second transmission circuit T2.

Furthermore, differences between the clock transmission circuit according to the third embodiment of the present disclosure and the clock transmission circuit according to the second embodiment, which has been described with reference to FIG. 8, include that, when N is 1, only one first selected inverter 92<4>, among the plurality of second inverters 92<1:4>, and only one second selected inverter 91<4>, among the plurality of first inverters 91<1:4>, are divided, thus only one second additional driver 93 and one second additional driver 94 are included, and the third inverter 85 and the fourth inverter 86 are not included.

According to an embodiment, only the fourth inverter 92<4>, among the plurality of second inverters 92<1:4>, is divided as the first selected inverter 92<4>, and the remaining first to third inverters 92<1:3> are not divided as "first selected inverter". Likewise, only the fourth inverter 91<4>, among the plurality of first inverters 91<1:4>, is divided as the second selected inverter 91<4>, and the remaining first to third inverters 91<1:3> are not divided as "second selected inverter".

According to an embodiment, the first additional drivers 93 drives the output node O1<4> of the second selected inverter 91<4> in response to a signal that is loaded onto the input node I2<4> of the first selected inverter 92<4>.

Furthermore, each of the N second additional drivers 94 drives the output node O2<4> of the first selected inverter 92<4> in response to a signal that is loaded onto the input node I1<4> of the second selected inverter 91<4>.

In this case, the first additional drivers 93<4> and the second additional drivers 94 correspond to the first additional driver 13 and the second additional driver 14, respectively, which have been described with reference to FIG. 1, for example. Furthermore, the first selected inverter 92<4> and the second selected inverter 91<4> correspond to the first inverter 9 and the second inverter 12, respectively, which have been described with reference to FIG. 1, for example.

Accordingly, reference may be made to the embodiment described with reference to any one of FIGS. 2 to 7, for an embodiment of a detailed circuit of each of the first additional drivers 93 and the second additional drivers 94.

In the clock transmission circuit according to the third embodiment of the present disclosure, the driving force of the fourth inverters 91<4> and 92<4> is relatively greater than the driving force of the third inverters 91<3> and 92<3> in that only the fourth inverters 91<4> and 92<4>, among the plurality of first and second inverters 91<1:4> and 92<1:4>, are divided as the first and second selected inverters 92<4>, 91<4>.

Figure 10:
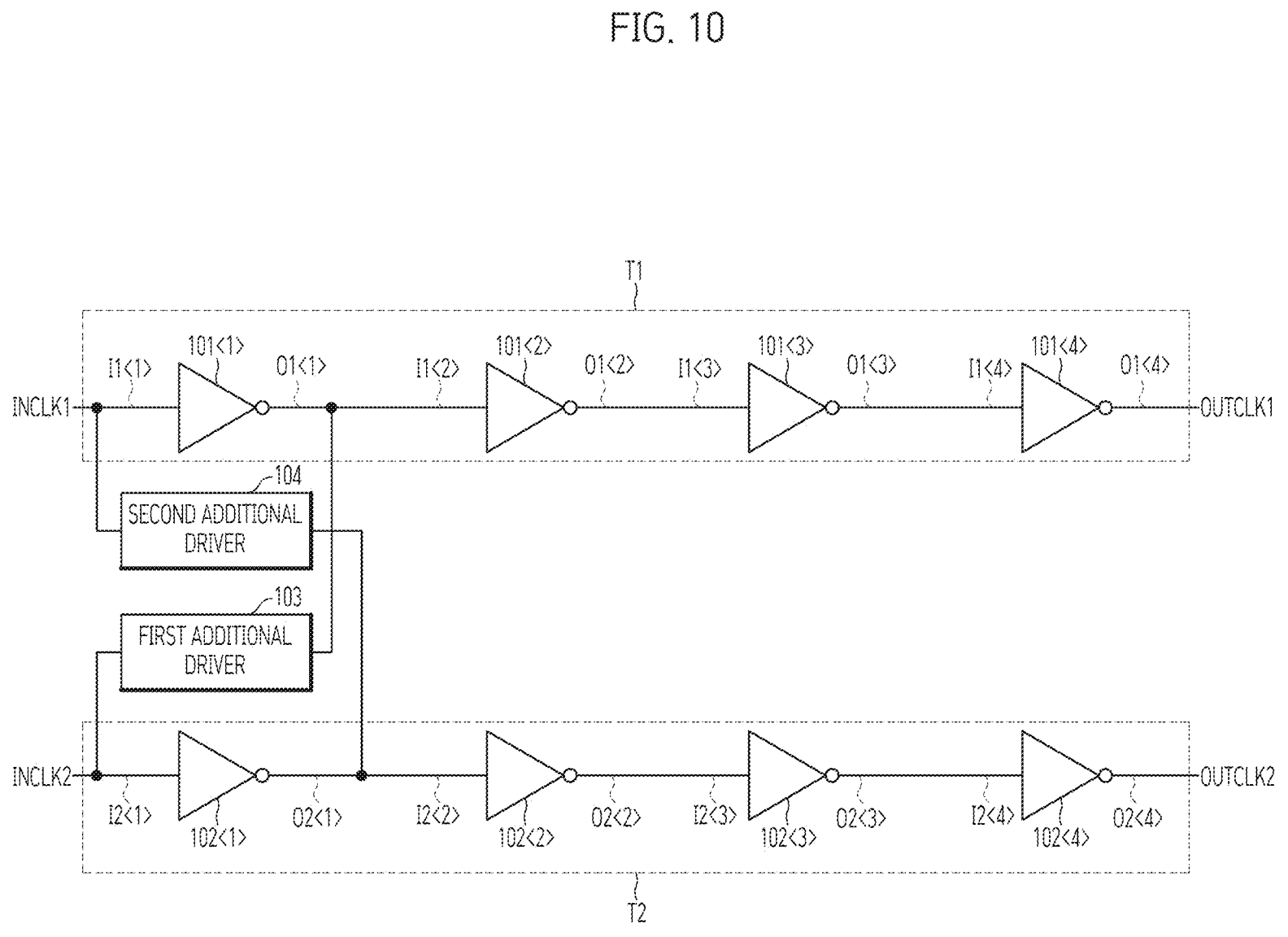

FIG. 10 is a diagram for describing a clock transmission circuit according to a fourth embodiment of the present disclosure.

Referring to FIG. 10, the clock transmission circuit according to the fourth embodiment of the present disclosure includes a first transmission circuit T1, a second transmission circuit T2, N first additional drivers 103, and N second additional drivers 104. In this case, N may be a natural number equal to or greater than 1.

Specifically, the first transmission circuit T1 transmits a first clock signal INCLK1, among differential clock signals INCLK1 and INCLK2, through a plurality of first inverters 101<1:4> that are connected in a chain form.

Furthermore, the second transmission circuit T2 transmits a second clock signal INCLK2, among the differential clock signals INCLK1 and INCLK2, through a plurality of second inverters 102<1:4> that are connected in a chain form and that correspond to the plurality of first inverters 101<1:4>, respectively.

Furthermore, each of the N first additional drivers 103 drives the output node O1<1> of each of the N second selected inverters 101<1> corresponding to the N first selected inverters 102<1>, respectively, among the plurality of first inverters 101<1:4>, in response to a signal that is loaded onto the input node I2<1> of each of the N first selected inverters 102<1>, among the plurality of second inverters 102<1:4>.

Furthermore, each of the N second additional drivers 104 drives the output node O2<1> of each of the N first selected inverters 102<1> in response to a signal that is loaded onto the input node I1<1> of each of the N second selected inverters 101<1>.

It may be seen that the first transmission circuit T1 and the second transmission circuit T2 that are included in the clock transmission circuit according to the fourth embodiment of the present disclosure correspond to the first transmission circuit T1 and the second transmission circuit T2, respectively, which are included in the clock transmission circuit according to the second embodiment described with reference to FIG. 8. Accordingly, reference may be made to FIG. 8, for detailed constructions and operations of the first transmission circuit T1 and the second transmission circuit T2.

Furthermore, differences between the clock transmission circuit according to the fourth embodiment of the present disclosure and the clock transmission circuit according to the second embodiment which has been described with reference to FIG. 8, include when N is 1, only one first selected inverter 102<4>, among the plurality of second inverters 102<1:4>, and only one second selected inverter 101<4>, among the plurality of first inverters 101<1:4>, are divided, thus only one second additional driver 103 and one second additional driver 104 are included, and the third inverter 85 and the fourth inverter 86 are not included.

According to an embodiment, only the first inverter 102<1>, among the plurality of second inverters 102<1:4>, is divided as the first selected inverter 102<1>, and the remaining second to fourth inverters 102<2:4> are not divided as "first selected inverter". Likewise, only the first inverter 101<1>, among the plurality of first inverters 101<1:4>, is divided as the second selected inverter 101<1>, and the remaining second to fourth inverters 101<2:4> are not divided as "second selected inverter".

According to an embodiment, the first additional drivers 103 drives the output node O1<1> of the second selected inverter 101<1> in response to a signal that is loaded onto the input node I2<1> of the first selected inverter 102<1>.

Furthermore, the second additional drivers 104 drives the output node O2<1> of the first selected inverter 102<1> in response to a signal that is loaded onto the input node I1<1> of the second selected inverter 101<1>.

In this case, the first additional drivers 103 and the second additional drivers 104 correspond to the first additional driver 13 and the second additional driver 14, respectively, which have been described with reference to FIG. 1, for example. Furthermore, the first selected inverter 102<1> and the second selected inverter 101<1> correspond to the first inverter 10 and the second inverter 12, respectively, which have been described with reference to FIG. 1, for example.

Accordingly, reference may be made to the embodiment described with reference to any of FIGS. 2 to 7, for an embodiment of a detailed circuit of each of the first additional drivers 103 and the second additional drivers 104.

In the clock transmission circuit according to the fourth embodiment of the present disclosure, the driving force of the second inverters 101<2> and 102<2> is relatively greater than the driving force of the first inverters 101<1> and 102<1> in that only the first inverters 101<1> and 102<1>, among the plurality of first and second inverters 101<1:4> and 102<1:4>, are divided as the first and second selected inverters 102<1> and 101<1>.

FIG. 11 is a diagram for describing a clock transmission circuit according to a fifth embodiment of the present disclosure.

Referring to FIG. 11, the clock transmission circuit according to the fifth embodiment of the present disclosure includes a first transmission circuit T1, a second transmission circuit T2, N first additional drivers 113, and N second additional drivers 114. In this case, N may be a natural number equal to or greater than 1.

Specifically, the first transmission circuit T1 transmits a first clock signal INCLK1, among differential clock signals INCLK1 and INCLK2, through a plurality of first inverters 111<1:4> that are connected in a chain form.

Furthermore, the second transmission circuit T2 transmits a second clock signal INCLK2, among the differential clock signals INCLK1 and INCLK2, through a plurality of second inverters 112<1:4> that are connected in a chain form and correspond to the plurality of first inverters 111<1:4>, respectively.

Furthermore, each of the N first additional drivers 113 drives the output node O1<1, 4> of each of the N second selected inverters 111<1, 4> corresponding to the N first selected inverters 112<1, 4>, respectively, among the plurality of first inverters 111<1:4>, in response to a signal that is loaded onto the input node I2<1, 4> of each of the N first selected inverters 112<1, 4>, among the plurality of second inverters 112<1:4>.

Furthermore, each of the N second additional drivers 114 drives the output node O2<1, 4> of each of the N first selected inverters 112<1, 4> in response to a signal that is loaded onto the input node I1<1, 4> of each of the N second selected inverters 111<1, 4>.

It may be seen that the first transmission circuit T1 and the second transmission circuit T2 that are included in the clock transmission circuit according to the fifth embodiment of the present disclosure correspond to the first transmission circuit T1 and the second transmission circuit T2 that are included in the clock transmission circuit according to the second embodiment described with reference to FIG. 8. Accordingly, reference may be made to FIG. 8, for detailed constructions and operations of the first transmission circuit T1 and the second transmission circuit T2.

Furthermore, it may be seen that the clock transmission circuit according to the fifth embodiment of the present disclosure and the clock transmission circuit according to the second embodiment, which has been described with reference to FIG. 8, are the same in that when N is 2, the two first selected inverters 112<1, 4>, among the plurality of second inverters 112<1:4>, and the two second selected inverters 111<1, 4>, among the plurality of first inverters 111<1:4>, are included, the two first additional drivers 113<1, 4> and the two second additional drivers 114<1, 4> are included, and the third inverter 115 and the fourth inverter 116 are included. Differences between the clock transmission circuit according to the fifth embodiment of the present disclosure and the clock transmission circuit according to the second embodiment which has been described with reference to FIG. 8, include that locations at which the two first and second selected inverters 112<1, 4> and 111<1, 4>, among the plurality of first and second inverters 111<1:4> and 112<1:4>, are disposed are different and locations at which a third inverter 115 and a fourth inverter 116 are disposed are different.

According to an embodiment, the first inverter 112<1> and the fourth inverter 112<4>, among the plurality of second inverters 112<1:4>, are divided as the first selected inverter 112<1>, and the remaining second and third inverters 112<2:3> are not divided as "first selected inverter". Likewise, the first inverter 111<1> and the fourth inverter 111<4>, among the plurality of first inverters 111<1:4>, are divided as the second selected inverter 111<1>, and the remaining second and third inverters 111<2:3> are not divided as "second selected inverter".

According to an embodiment, the 1st first additional driver 113<1>, among the two first additional drivers 113<1, 4>, drives the output node O1<1> of the 1st second selected inverter 111<1>, among the two second selected inverters 111<1, 4>, in response to a signal that is loaded onto the input node I2<1> of the 1st first selected inverter 112<1>, among the two first selected inverters 112<1, 4>.

Furthermore, the 1st second additional driver 114<1>, among the two second additional drivers 114<1, 4>, drives the output node O2<1> of the 1st first selected inverter 112<1>, among the two first selected inverters 112<1, 4>, in response to a signal that is loaded onto the input node I1<1> of the 1st second selected inverter 111<1>, among the two second selected inverters 111<1, 4>.

Furthermore, the 2nd first additional driver 113<4>, among the two first additional drivers 113<1, 4>, drives the output node O1<4> of the 2nd second selected inverter 111<4>, among the two second selected inverters 111<1, 4>, in response to a signal that is loaded onto the input node I2<4> of the 2nd first selected inverter 112<4>, among the two first selected inverters 112<1, 4>.

Furthermore, the 2nd second additional driver 114<4>, among the two second additional drivers 114<1, 4>, drives the output node O2<4> of the 2nd first selected inverter 112<4>, among the two first selected inverters 112<1, 4>, in response to a signal that is loaded onto the input node I1<4> of the 2nd second additional driver 111<4>, among the two second selected inverters 111<1, 4>.

In this case, the 1st first additional driver 113<1>, among the two first additional drivers 113<1, 4>, and the 1st second additional driver 114<1>, among the two second additional drivers 114<1, 4>, correspond to the first additional driver 13 and the second additional driver 14, respectively, which have been described with reference to FIG. 1, for example. Furthermore, the 1st first selected inverter 112<1>, among the two first selected inverters 112<1, 4>, and the 1st second selected inverter 111<1>, among the two second selected inverters 111<1, 4>, correspond to the first inverter 11 and the second inverter 12, respectively, which have been described with reference to FIG. 1, for example.

Accordingly, reference may be made to the embodiment described with reference to any of FIGS. 2 to 7, for an embodiment of a detailed circuit of each of the 1st first additional driver 113<1>, among the two first additional drivers 113<1, 4>, and the 1st second additional driver 114<1>, among the two second additional drivers 114<1, 4>.

Likewise, the 2nd first additional driver 113<4>, among the two first additional drivers 113<1, 4>, and the 2nd second additional driver 114<4>, among the two second additional drivers 114<1, 4>, correspond to the first additional driver 13 and the second additional driver 14, respectively, which have been described with reference to FIG. 1, for example. Furthermore, the 2nd first selected inverter 112<4>, among the two first selected inverters 112<1, 4>, and the 2nd second selected inverter 111<4>, among the two second selected inverters 111<1, 4>, correspond to the first inverter 11 and the second inverter 12, respectively, which have been described with reference to FIG. 1, for example.

Accordingly, reference may be made to the embodiment described with reference to any of FIGS. 2 to 7, for an embodiment of a detailed circuit of each of the 2nd first additional driver 113<4>, among the two first additional drivers 113<1, 4>, and the 2nd second additional driver 114<4>, among the two second additional drivers 114<1, 4>.

According to an embodiment, the clock transmission circuit according to the fifth embodiment of the present disclosure includes the third inverter 115 that inversion-drives the output node O2<2> of the 2nd second inverter 112<2> in response to a signal that is loaded onto the output node O1<2> of the 2nd first inverter 111<2> and the fourth inverter 116 that inversion-drives the output node O1<2> of the 2nd first inverter 111<2> in response to a signal that is loaded onto the output node O2<2> of the 2nd second inverter 112<2>.

In the clock transmission circuit according to the fifth embodiment of the present disclosure, the driving force of the second inverters 111<2> and 112<2> is relatively greater than the driving force of the first inverters 111<1> and 112<1> and the driving force of the fourth inverters 111<4> and 112<4> is relatively greater than the driving force of the third inverters 111<3> and 112<3> in that the first and fourth inverters 111<1, 4> and 112<1, 4>, among the plurality of first and second inverters 111<1:4> and 112<1:4>, are divided as the first and second selected inverters 112<1, 4> and 111<1, 4>.

Furthermore, in the clock transmission circuit according to the fifth embodiment of the present disclosure, the driving force of the $2^{nd}$ first and second inverters 111<2> and 112<2> and the driving force of the $3^{rd}$ first and second inverters 111<3> and 112<3> are the same in that the third inverter 115 and the fourth inverter 116 are disposed between the output nodes O1<2> and O2<2> of the $2^{nd}$ first and second inverters 111<2> and 112<2>, among the plurality of first and second inverters 111<1:4> and 112<1:4>.

Figure 12:
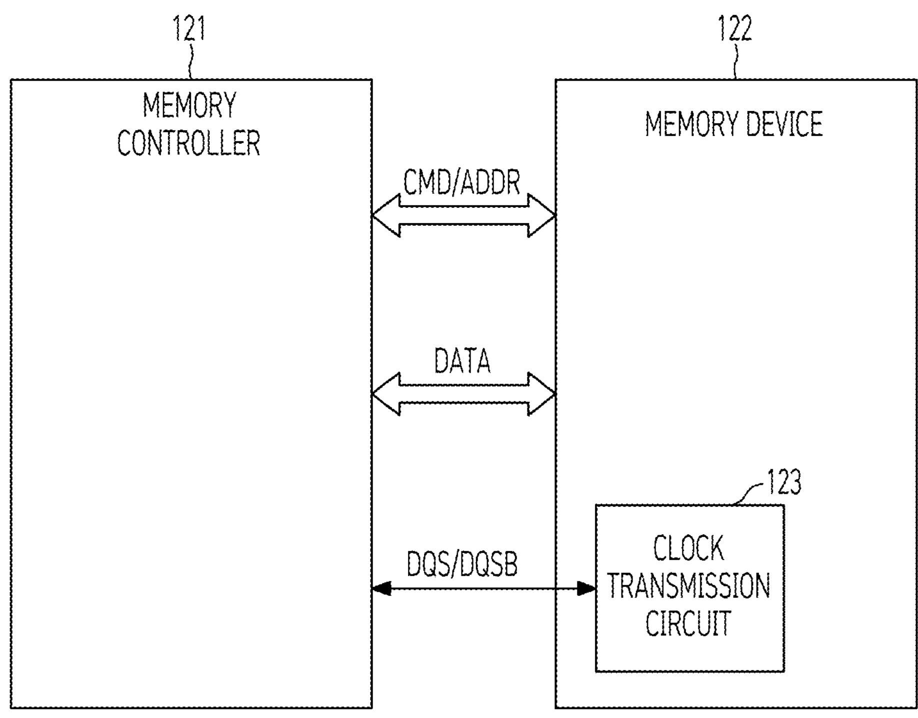
FIG. 12 is a diagram illustrating a memory system to which a clock transmission circuit according to an embodiment of the present disclosure is applied.

FIG. 12 is a diagram illustrating a memory system to which a clock transmission circuit according to an embodiment of the present disclosure is applied.

Referring to FIG. 12, in an embodiment, the memory system includes a memory controller 121 and a memory device 122 as a semiconductor device. In this case, the memory device 122 includes a clock transmission circuit 123 that receives, transmits, and buffers data strobe signals DQS/DQSB, for example.

The memory controller 121 transmits a command and address CMD/ADDR in order to control the memory device 122. Furthermore, the memory controller 121 receives data DATA that are read from the memory device 122 or transmits data DATA to be written to the memory device 122.

The data strobe signals DQS/DQSB are signals that are used to strobe the data DATA that are transmitted between the memory controller 121 and the memory device 122. According to an embodiment, the memory controller 121 transmits the data strobe signals DQS/DQSB to the memory device 122 along with the data DATA to be written. Furthermore, the memory device 122 transmits the data strobe signals DQS/DQSB to the memory controller 121 along with the data DATA that are read from the memory device 122.

The data strobe signals DQS/DQSB are differential clock signals that are toggled at a set frequency, for example. That is, the data strobe signals DQS/DQSB are transmitted in the form of differential signals between the memory controller 121 and the memory device 122.

According to an embodiment, the data strobe signals DQS/DQSB are the differential clock signals INCLK1 and INCLK2 illustrated in FIGS. 1 to 11. Furthermore, for example, a main signal DQS, among the data strobe signals DQS/DQSB, is the first clock signal INCLK1, among the differential clock signals INCLK1 and INCLK2. For example, a sub-signal DQSB, among the data strobe signals DQS/DQSB, is the second clock signal INCLK2, among the differential clock signals INCLK1 and INCLK2. On the contrary, for example, the main signal DQS, among the data strobe signals DQS/DQSB, is the second clock signal INCLK2, among the differential clock signals INCLK1 and INCLK2. For example, the sub-signal DQSB, among the data strobe signals DQS/DQSB, is the first clock signal INCLK1, among the differential clock signals INCLK1 and INCLK2.

For reference, the memory device 122 may be any memory device, among a volatile memory device and a nonvolatile memory device. In this case, the volatile memory device is a memory device in which data stored in the memory device are lost when the supply of power to the memory device is blocked. The volatile memory device includes static RAM (SRAM), dynamic RAM (DRAM), and synchronous DRAM (SDRAM), for example. Furthermore, the nonvolatile memory device is a memory device in which data stored in the memory device are retained although the supply of power to the memory device is blocked. The nonvolatile memory device includes read only memory (ROM), programmable ROM (PROM), electrically programmable ROM (EPROM), electrically erasable programmable ROM (EEPROM), a flash memory device, phase change RAM (PRAM), magnetic RAM (MRAM), resistive RAM (RRAM), and ferroelectric RAM (FRAM), for example.

It will be evident to a person having ordinary knowledge in the art to which the present disclosure pertains that the embodiments of the present disclosure described above is not limited by the aforementioned embodiments and the accompanying drawings and that the embodiments of the present disclosure may be substituted, modified, and changed in various ways without departing from the technical spirit of the present disclosure.

For example, the locations and types of the logic gates and the transistors illustrated in the aforementioned embodiments have to be differently implemented depending on the polarity of an input signal. Furthermore, the embodiments may be combined to form additional embodiments.

What is claimed is:

1. A clock transmission circuit comprising:

a first inverter configured to inversion-drive a first transmission node in response to a first clock signal, among differential clock signals that are loaded onto a first reception node;

a second inverter configured to inversion-drive a second transmission node in response to a second clock signal, among the differential clock signals that are loaded onto a second reception node;

a first additional driver configured to additionally drive the first transmission node in response to the second clock signal that is loaded onto the second reception node, and having a driving force less than a driving force of the first inverter; and a second additional driver configured to additionally drive the second transmission node in response to the first clock signal that is loaded onto the first reception node, and having a driving force less than a driving force of the second inverter.

2. The clock transmission circuit of claim 1, wherein:

the first additional driver comprises a first NMOS transistor having a gate terminal connected to the second reception node, a source terminal connected to the first transmission node, and a drain terminal connected to a node for a power source voltage; and the second additional driver comprises a second NMOS transistor having a gate terminal connected to the first reception node, a source terminal connected to the second transmission node, and a drain terminal connected to the node for the power source voltage.

3. The clock transmission circuit of claim 1, wherein:

the first additional driver comprises a first PMOS transistor having a gate terminal connected to the second reception node, a source terminal connected to the first transmission node, and a drain terminal connected to a node for a ground voltage; and the second additional driver comprises a second PMOS transistor having a gate terminal connected to the first reception node, a source terminal connected to the second transmission node, and a drain terminal connected to the node for the ground voltage.

4. The clock transmission circuit of claim 1, wherein:

the first additional driver comprises a third NMOS transistor having a gate terminal connected to the second reception node, a source terminal connected to the first transmission node, and a source terminal connected to a first middle node, and a fourth NMOS transistor having a gate terminal and a drain terminal connected to a node for a power source voltage and a source terminal connected to the first middle node; and the second additional driver comprises a fifth NMOS transistor having a gate terminal connected to the first reception node, a source terminal connected to the second transmission node, and a drain terminal connected to a second middle node, and a sixth NMOS transistor having a gate terminal and a drain terminal connected to the node for the power source voltage and a source terminal connected to the second middle node.

5. The clock transmission circuit of claim 1, wherein:

the first additional driver comprises a third PMOS transistor having a gate terminal connected to the second reception node, a source terminal connected to the first transmission node, and a drain terminal connected to a third middle node, and a fourth PMOS transistor having a gate terminal and a drain terminal connected to a node for a ground voltage and a source terminal connected to the third middle node; and the second additional driver comprises a fifth PMOS transistor having a gate terminal connected to the first reception node, a source terminal connected to the second transmission node, and a drain terminal connected to a fourth middle node, and a sixth PMOS transistor having a gate terminal and a drain terminal connected to the node for the ground voltage and a source terminal connected to the fourth middle node.

6. The clock transmission circuit of claim 1, wherein:

the first additional driver comprises a seventh NMOS transistor having a gate terminal connected to the second reception node, a source terminal connected to the first transmission node, and a drain terminal connected to a node for a power source voltage, and a seventh PMOS transistor having a gate terminal connected to the second reception node, a source terminal connected to the first transmission node, and a drain terminal connected to a node for a ground voltage; and the second additional driver comprises an eighth NMOS transistor having a gate terminal connected to the first reception node, a source terminal connected to the second transmission node, and a drain terminal connected to the node for the power source voltage, and an eighth PMOS transistor having a gate terminal connected to the first reception node, a source terminal connected to the second transmission node, and a drain terminal connected to the node for the ground voltage.

7. The clock transmission circuit of claim 1, wherein:

the first additional driver comprises a ninth NMOS transistor having a gate terminal connected to the second reception node, a source terminal connected to the first transmission node, and a drain terminal connected to a fifth middle node, a tenth NMOS transistor having a gate terminal and a drain terminal connected to a node for a power source voltage and a source terminal connected to the fifth middle node, a ninth PMOS transistor having a gate terminal connected to the second reception node, a source terminal connected to the first transmission node, and a drain terminal connected to a sixth middle node, and a tenth PMOS transistor having a gate terminal and a drain terminal connected to a node for a ground voltage and a source terminal connected to the sixth middle node; and the second additional driver comprises an eleventh NMOS transistor having a gate terminal connected to the first reception node, a source terminal connected to the second transmission node, and a drain terminal connected to a seventh middle node, a twelfth NMOS transistor having a gate terminal and a drain terminal connected to the node for the power source voltage and a source terminal connected to the seventh middle node, an eleventh PMOS transistor having a gate terminal connected to the first reception node, a source terminal connected to the second transmission node, and a drain terminal connected to an eighth middle node, and a twelfth PMOS transistor having a gate terminal and a drain terminal connected to the node for the ground voltage and a source terminal connected to the eighth middle node.

8. The clock transmission circuit of claim 1, wherein a phase of the first clock signal and a phase of the second clock signal are opposite to each other.

9. A clock transmission circuit comprising:

a first transmission circuit configured to transmit a first clock signal, among differential clock signals, through a plurality of first inverters that are connected in a chain form;

a second transmission circuit configured to transmit a second clock signal, among the differential clock signals, through a plurality of second inverters that are connected in a chain form and that correspond to the plurality of first inverters, respectively;

at least one first additional driver configured to additionally drive an output node of at least one second selected inverter corresponding to at least one first selected inverter, among the plurality of first inverters, in response to a signal that is loaded onto an input node of the at least one first selected inverter, among the plurality of second inverters; and at least one second additional driver configured to additionally drive an output node of the at least one first selected inverter in response to a signal that is loaded onto an input node of the at least one second selected inverter, wherein a driving force of each first additional driver is less than a driving force of each second selected inverter, and wherein a driving force of each second additional driver is less than a driving force of each first selected inverter.

10. The clock transmission circuit of claim 9, wherein:

the at least one first additional driver comprises at least one first NMOS transistor having a gate terminal connected to the input node of the at least one first selected inverter, a source terminal connected to the output node of the at least one second selected inverter, and a drain terminal connected to a node for a power source voltage; and the at least one second additional driver comprises at least one second NMOS transistor having a gate terminal connected to the input node of the at least one second selected inverter, a source terminal connected to the output node of the at least one first selected inverter, and a drain terminal connected to the node for the power source voltage.

11. The clock transmission circuit of claim 9, wherein:

the at least one first additional driver comprises at least one first PMOS transistor having a gate terminal connected to the input node of the at least one first selected inverter, a source terminal connected to the output node of the at least one second selected inverter, and a drain terminal connected to a node for a ground voltage; and the at least one second additional driver comprises at least one second PMOS transistor having a gate terminal connected to the input node of the at least one second selected inverters, a source terminal connected to the output node of the at least one first selected inverter, and a drain terminal connected to the node for the ground voltage.

12. The clock transmission circuit of claim 9, wherein the at least one first additional driver comprises at least one third NMOS transistor having a gate terminal connected to the input node of the at least one first selected inverter, a source terminal connected to the output node of the at least one second selected inverter, and a drain terminal connected to at least one first middle node; and at least one fourth NMOS transistor having a gate terminal and a drain terminal connected to a node for a power source voltage and a source terminal connected to the at least one first middle node; and the at least one second additional driver comprises at least one fifth NMOS transistor having a gate terminal connected to the input node of the at least one second selected inverter, a source terminal connected to the output node of the at least one first selected inverter, and a drain terminal connected to at least one second middle node, and at least one sixth NMOS transistor having a gate terminal and a drain terminal connected to the node for the power source voltage and a source terminal connected to the at least one second middle node.

13. The clock transmission circuit of claim 9, wherein:

the at least one first additional driver comprises at least one third PMOS transistor having a gate terminal connected to the input node of the at least one first selected inverter, a source terminal connected to the output node of the at least one second selected inverter, and a drain terminal connected to at least one third middle node, and at least one fourth PMOS transistor having a gate terminal and a drain terminal connected to a node for a ground voltage and a source terminal connected to the at least one third middle node; and the at least one second additional driver comprises at least one fifth PMOS transistor having a gate terminal connected to the input node of the at least one second selected inverter, a source terminal connected to the output node of the at least one first selected inverter, and a drain terminal connected to at least one fourth middle node, and at least one sixth PMOS transistor having a gate terminal and a drain terminal connected to the node for the ground voltage and a source terminal connected to the at least one fourth middle node.

14. The clock transmission circuit of claim 9, wherein:

the at least one first additional driver comprises at least one seventh NMOS transistor having a gate terminal connected to the input node of the at least one first selected inverter, a source terminal connected to the output node of the at least one second selected inverter, and a drain terminal connected to a node for a power source voltage, and at least one seventh PMOS transistor having a gate terminal connected to the input node of the at least one first selected inverter, a source terminal connected to the output node of the at least one second selected inverter, and a drain terminal connected to a node for a ground voltage; and the N second additional driver comprises at least one eighth NMOS transistor having a gate terminal connected to the input node of the at least one second selected inverter, a source terminal connected to the output node of the at least one first selected inverter, and a drain terminal connected to the node for the power source voltage, and at least one eighth PMOS transistor having a gate terminal connected to the input node of the at least one second selected inverter, a source terminal connected to the output node of the at least one first selected inverter, and a drain terminal connected to the node for the ground voltage.

15. The clock transmission circuit of claim 9, wherein:

the at least one first additional driver comprises at least one ninth NMOS transistor having a gate terminal connected to the input node of the at least one first selected inverter, a source terminal connected to the output node of the at least one second selected inverter, and a drain terminal connected to at least one fifth middle node, at least one tenth NMOS transistors having a gate terminal and a drain terminal connected to a node for a power source voltage and a source terminal connected to the at least one fifth middle node, at least one ninth PMOS transistor having a gate terminal connected to the input node of the at least one first selected inverter, a source terminal connected to the output node of the at least one second selected inverter, and a drain terminal connected to at least one sixth middle node, and at least one tenth PMOS transistor having a gate terminal and a drain terminal connected to a node for a ground voltage and a source terminal connected to the at least one sixth middle node; and the at least one second additional driver comprises at least one eleventh NMOS transistor having a gate terminal connected to the input node of the at least one second selected inverter, a source terminal connected to the output node of the at least one first selected inverter, and a drain terminal connected to at least one seventh middle node, at least one twelfth NMOS transistor having a gate terminal and a drain terminal connected to the node for the power source voltage and a drain terminal connected to the at least one seventh middle node, at least one eleventh PMOS transistor having a gate terminal connected to the input node of the at least one second selected inverter, a source terminal connected to the output node of the at least one first selected inverter, and a drain terminal connected to at least one eighth middle node, and at least one twelfth PMOS transistor having a gate terminal and a drain terminal connected to the node for the ground voltage and a source terminal connected to the at least one eighth middle node.

16. The clock transmission circuit of claim 9, wherein a phase of the first clock signal and a phase of the second clock signal are opposite to each other.

17. The clock transmission circuit of claim 9, wherein when a driving force of first and second inverters in a following order, among the plurality of first and second inverters, is greater than a driving force of first and second inverters in a previous order, the first and second inverters in the previous order are determined as the at least one second selected inverter and the at least one first selected inverter or the first and second inverters in the following order are determined as the at least one second selected inverter and the at least one first selected inverter.

18. The clock transmission circuit of claim 17, further comprising third and fourth inverters configured to inversion-drive output nodes of the second and first inverters, respectively, in response to a signal that is loaded onto output nodes of the first and second inverters in the previous order, when the driving force of the first and second inverters in the previous order, among the plurality of first and second inverters, and the driving force of the first and second inverters in the following order are identical with each other.

* * * * *